(12) United States Patent
Kaulgud et al.

(10) Patent No.: US 10,140,191 B2
(45) Date of Patent: Nov. 27, 2018

(54) SYSTEM FOR DEVELOPMENT OF IOT SYSTEM ARCHITECTURE

(71) Applicant: Accenture Global Services Limited, Dublin (IE)

(72) Inventors: Vikrant S. Kaulgud, Pune (IN); Aditya Bhola, Jabalpur (IN); Venkatesh Subramanian, Bangalore (IN); Subani Basha Nure, Bangalore (IN); Vibhu Saujanya Sharma, Bangalore (IN)

(73) Assignee: Accenture Global Services Limited, Dublin (IE)

( * ) Notice: Subject to any disclaimer, the term of this patent is extended or adjusted under 35 U.S.C. 154(b) by 147 days.

(21) Appl. No.: 15/209,324

(22) Filed: Jul. 13, 2016

(65) Prior Publication Data
US 2017/0024290 A1 Jan. 26, 2017

(30) Foreign Application Priority Data
Jul. 24, 2015 (IN) .......................... 3823/CHE/2015

(51) Int. Cl.
*G06F 11/14* (2006.01)
*G06F 11/30* (2006.01)
*G06F 11/00* (2006.01)

(52) U.S. Cl.
CPC .......... *G06F 11/1479* (2013.01); *G06F 11/00* (2013.01); *G06F 11/3006* (2013.01)

(58) Field of Classification Search
CPC ....... G06F 11/14; G06F 11/1479; G06F 11/00
USPC .......................................................... 714/49
See application file for complete search history.

(56) References Cited

U.S. PATENT DOCUMENTS

| | | | |
|---|---|---|---|
| 2002/0138297 A1* | 9/2002 | Lee ........................ | G06Q 10/10 705/310 |
| 2014/0351790 A1* | 11/2014 | Ghose ...................... | G06F 8/70 717/120 |
| 2015/0163289 A1* | 6/2015 | Paul ........................ | H04L 67/02 709/201 |
| 2015/0169768 A1* | 6/2015 | Xu .................... | G06F 17/30864 707/770 |
| 2015/0195145 A1* | 7/2015 | Di Pietro ............. | G06N 99/005 706/12 |
| 2015/0249672 A1* | 9/2015 | Burns ..................... | H04L 12/66 726/4 |
| 2016/0065653 A1* | 3/2016 | Chen ....................... | H04L 67/10 715/735 |
| 2016/0119434 A1* | 4/2016 | Dong .................. | H04L 41/5054 709/220 |
| 2016/0182446 A1* | 6/2016 | Kong ....................... | H04L 69/08 709/245 |

(Continued)

FOREIGN PATENT DOCUMENTS

WO WO 2004/006093 1/2004

*Primary Examiner* — Kamini B Patel
(74) *Attorney, Agent, or Firm* — Harrity & Harrity, LLP

(57) ABSTRACT

A system may include one or more server devices. The system may provide a set of questions, to a user of a user device, to characterize an Internet of things system. The system may obtain responses from the user of the user device associated with each of the set of questions. The system may automatically create an Internet of things system architecture that defines the Internet of things system by applying associated Internet of things system architecture rules to the responses.

20 Claims, 23 Drawing Sheets

(56) References Cited

U.S. PATENT DOCUMENTS

| | | | |
|---|---|---|---|
| 2016/0291826 A1* | 10/2016 | Verzano | H04L 41/145 |
| 2016/0350471 A1* | 12/2016 | Ha | G06F 17/5081 |
| 2016/0380968 A1* | 12/2016 | Sarwar | H04W 88/16 |
| | | | 709/245 |
| 2017/0235783 A1* | 8/2017 | Chen | G06F 17/30371 |
| | | | 707/691 |
| 2017/0236080 A1* | 8/2017 | Singh | G06Q 10/0635 |
| | | | 705/7.28 |
| 2017/0264485 A1* | 9/2017 | Papleux | H04L 67/12 |
| 2017/0277800 A1* | 9/2017 | Lucas | G06F 8/35 |
| 2017/0372088 A1* | 12/2017 | Zhao | G06F 21/6218 |

\* cited by examiner

General Rules:

1. If <Scalability (Data)> Then <Architecture Components>

Example Rules Corresponding to the General Rules:

1. If <Low velocity-low volume> Then <Data Ingest (Direct Rest)>

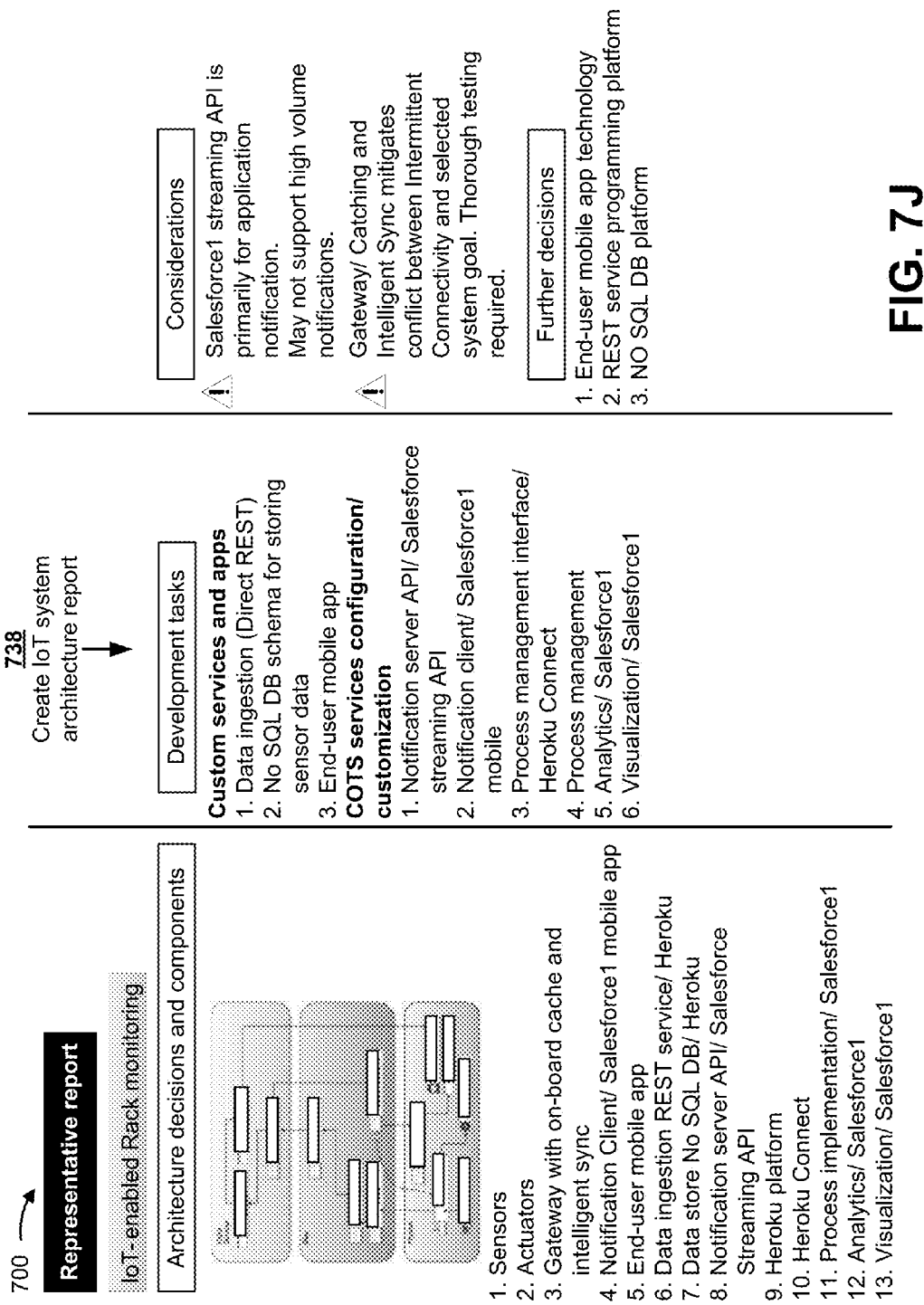

SYSTEM FOR DEVELOPMENT OF IOT SYSTEM ARCHITECTURE

RELATED APPLICATION

This application claims priority under 35 U.S.C. § 119 to Indian Patent Application No. 3823/CHE/2015, filed on Jul. 24, 2015, the content of which is incorporated by reference herein in its entirety.

BACKGROUND

The Internet of things (IoT) refers to a network of physical objects with Internet connectivity, and the communication between such objects and other Internet-enabled devices and systems. The IoT extends Internet connectivity beyond traditional devices (e.g., desktop computers, laptop computers, smart phones, tablets, etc.) to a range of devices and everyday things that may utilize embedded technology to communicate and interact with an external environment via the Internet.

SUMMARY

According to some possible implementations, a system may include one or more server devices. The service device(s) may provide a set of questions, to a user of a user device, to characterize an Internet of things system. The service device(s) may obtain responses from the user of the user device associated with each of the set of questions. The service device(s) may automatically create an Internet of things system architecture that defines the Internet of things system by applying associated Internet of things system architecture rules to the responses.

According to some possible implementations, a computer-readable medium may store one or more instructions that, when executed by one or more processors, may cause the one or more processors to provide a set of questions, to a user of a user device, to characterize an Internet of things system. The one or more instructions, when executed by the one or more processors, may cause the one or more processors to obtain responses, from the user of the user device, associated with each of the set of questions. The one or more instructions, when executed by the one or more processors, may cause the one or more processors to identify previously created, obtained, and/or stored Internet of things system architecture, Internet of things system architecture components, and/or associated best practices that are relevant to an Internet of things system architecture. The one or more instructions, when executed by the one or more processors, may cause the one or more processors to automatically create the Internet of things system architecture that defines the Internet of things system by applying associated Internet of things system architecture rules to the responses. The Internet of things system architecture may be created using the previously created, obtained, and/or stored Internet of things system architecture, Internet of things system architecture components, and/or associated best practices.

According to some possible implementations, a method may include providing a set of questions, to a user of a user device, to characterize an Internet of things system. The method may include obtaining from the user of the user device associated with the set of questions. The method may include identifying previously created, obtained, and/or stored Internet of things system architecture, Internet of things system architecture components, and/or associated best practices that are relevant to automatically creating an Internet of things system architecture. The method may include automatically creating the Internet of things system architecture that defines the Internet of things system by applying associated Internet of things system architecture rules to the responses. The Internet of things system architecture may be created using the previously created, obtained and/or stored Internet of things system architecture, IoT system architecture components, and/or associated best practices. The method may include outputting the Internet of things system architecture.

BRIEF DESCRIPTION OF THE DRAWINGS

FIGS. 7A-7L are diagrams of an example implementation relating to the example process shown in FIGS. 6A and 6B.

DETAILED DESCRIPTION

Figure 1:
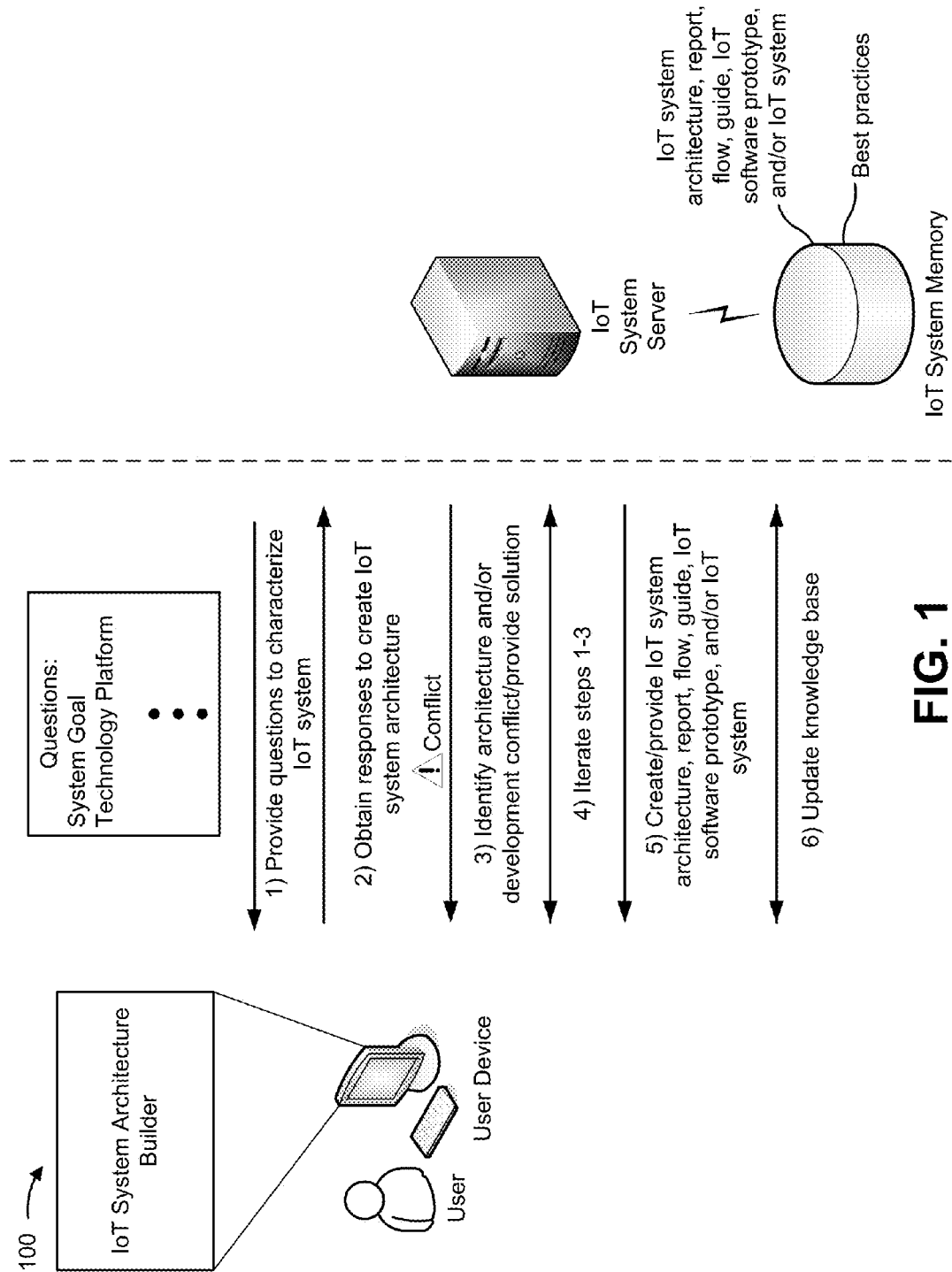
FIG. 1 is a diagram of an overview of an example implementation described herein.

The following detailed description of example implementations refers to the accompanying drawings. The same reference numbers in different drawings may identify the same or similar elements.

IoT refers to a network of physical objects (IoT devices) embedded with electronics, software, sensors, and connectivity to enable the IoT devices to achieve greater value and service by exchanging data with manufacturers, operators, and/or other connected devices. An IoT device is identifiable through the IoT device's embedded computing system and includes an Internet Protocol (IP) address for connectivity. IoT devices may include connected security systems, thermostats, cars, electronic appliances, lights, alarm clocks, speaker systems, vending machines, industrial sensors and actuators, wearable computers, and much more.

A particular IoT device may be included in an IoT system to perform a particular function (e.g., an IoT device may be included in a smart home system to monitor/control lights, thermostats, security, or the like; an IoT device may be included in a medical monitoring/data aggregation system to perform medical analysis; etc.). An IoT system architecture may be created to assist an IoT system developer in developing the IoT system.

An IoT system architecture is a structured solution (e.g., a blueprint), identifying hardware and/or software (e.g., IoT system architecture components), to meet technical and/or operational requirements of an IoT system. Generally, IoT system architecture components may be categorized into three layers: (1) a physical component/device layer for gathering data (e.g., sensors, gateways, radio frequency identification (RFID), etc.); (2) an interface layer/protocol for collecting and/or processing data for use by an associated application and/or a process/service (e.g., a middleware, a data collector, a data processor, a network solution, etc.); and (3) an applications and/or process/services layer for processing the data, provided by the interface layer/protocol, into valuable information that may be used by a user of the application and/or process/services (e.g., a supply chain automation system, a decision support system (DSS), an enterprise information system (EIS), everything as a server (XaaS), etc.).

An IoT system architecture defines a relationship of the IoT system architecture components to each other and their environment. Additionally, an IoT system architecture optimizes quality attributes, such as performance, security, manageability, or the like, for the structured solution. An IoT system architecture may be specific to a specific IoT system, however, an IoT system architecture may be relevant when developing other IoT systems similar to the specific IoT system.

Presently, there are billions of IoT devices included in various IoT systems, connected to the Internet, and growing. Developing IoT system architectures to support such diverse functionality and use for the growing number of IoT devices and/or IoT systems may prove challenging. As a result, scalability of the IoT systems may be limited.

Implementations described herein may provide for an automated system for creating an IoT system architecture for developing an IoT system. The system may create the IoT system architecture by characterizing the IoT system (e.g., obtaining IoT system requirements) and by applying IoT system architecture rules associated with ways in which the IoT system may be characterized.

Additionally, or alternatively, the system may create the IoT system architecture by using and/or reusing previously created/obtained IoT system architectures, previously created/obtained IoT system architecture components, and/or associated best practices that may be relevant to the IoT system architecture (e.g., by using a previously created/obtained IoT system architecture, where the associated IoT system was characterized in a same or similar way to the IoT system the user seeks to create; by using previously created/obtained IoT system architecture components, where the associated IoT system was characterized in a same or similar way to the IoT system the user seeks to create; by using previously created/obtained best practices, where the associated IoT system was characterized in a same or similar way to the IoT system the user seeks to create; etc.).

Additionally, and/or alternatively, the system may create an associated IoT system architecture report, an associated IoT system architecture flow, and/or an associated IoT system architecture guide. In some implementations, the system may create an IoT software prototype and/or an IoT system, based on the IoT system architecture created.

FIG. 1 is a diagram of an overview of an example implementation 100 described herein. As shown in FIG. 1, example implementation 100 may include a user device, such as a personal computer and an IoT system server (e.g., IoT System Sever). Assume a user (e.g., an IoT system developer) of the user device seeks to create an IoT system (e.g., an IoT patient heart monitoring system) that may be provided/sold to, for example, a third-party (e.g., a hospital customer) after development. As shown in FIG. 1, the user may use an IoT software application (e.g., an IoT System Architecture Builder), provided by the user device and associated with the IoT system server to create the IoT system architecture.

The IoT system architecture may be created by characterizing the IoT system the user seeks to create. The IoT system may be characterized by obtaining various information related to the IoT system (e.g., a system goal, a technology platform, connectivity, scalability, an end-user-role, etc.). As shown in FIG. 1, and by reference number 1, to create the IoT system architecture, the IoT system server may provide questions to the user of the user device, via the IoT software application, to characterize the IoT system (e.g., 'What is the system goal desired?'). The questions may be provided in a particular sequence (e.g., a linear sequence, a decision tree format, etc.).

As shown in FIG. 1, and by reference number 2, the IoT system server may obtain responses to create the IoT system architecture. The IoT system server may obtain responses from the user of the user device to the questions provided by the IoT system server (e.g., the system goal is 'Goal A' to the question 'What is the system goal desired?'). As shown in FIG. 1, and by reference number 2, the IoT system server may create the IoT system architecture by applying an associated IoT system architecture rule based on the responses. IoT system architecture rules are predetermined rules that determine, based on the responses, which IoT system architecture components to use for creating the IoT system architecture.

The IoT system architecture rules may be obtained from the user of the user device, the IoT system server, and/or another device, based on, for example, associated best practices determined from previously created/obtained IoT system architectures and/or IoT systems. The IoT system architecture rules may be conditional statements (e.g., an if-then construct, an if-then else construct, etc.).

For example, an IoT system architecture rule (e.g., Rule 1) may be 'If a system goal is Goal A, then create the IoT system architecture using a heart monitoring sensor for the physical component/device layer, an API for the interface layer/protocol, and a software application A for the applications and/or process-services layer.' As shown in FIG. 1, and by reference number 2, the IoT system server may select to apply Rule 1, based on the response of the user of the user device that the system goal is Goal A, to create the IoT system architecture (e.g., creating an IoT system architecture including a heart monitoring sensor for the physical device/component layer, an API for the interface layer/protocol, and a software application A for the applications/process-services layer).

As shown in FIG. 1, and by reference number 3, the IoT system server may identify architecture and/or development conflicts and/or provide a solution. The IoT system server my identify architecture and/or development conflicts by applying the IoT system architecture rules, based on the responses. For example, the IoT system server may provide a question related to characterizing a system goal and a question related to characterizing a connectivity type for the IoT system (e.g., 'What is the system goal?' and 'What is the connectivity type?'). The user of the user device may provide responses to the questions provided by the IoT system server (e.g., the system goal is 'Goal A' in response to the question 'What is the system goal?' and the connectivity type is 'Connectivity Type B' in response to the question 'What is the connectivity type?').

An IoT system architecture rule may provide that a system goal=Goal A may conflict with the connectivity type=Connectivity Type B. Based on the IoT system architecture rule, the IoT system server may identify an architecture and/or development conflict based on the response from the user of the user device. The IoT system server may provide a notification to the user device, identifying the architecture and/or development conflict (e.g., a notification indicating that Goal A is incompatible with Connectivity Type B and may lead to the IoT system failing).

As shown in FIG. 1, and by reference number 3, the IoT system server may provide a solution to the architecture and/or development conflict based on previously created/obtained best practices, including previously determined/identified solutions for a same or a similar architecture and/or development conflict.

As shown in FIG. 1, and by reference number 4, the user and the IoT system server may iterate steps shown by reference numbers 1-3. The IoT system server may continue to provide questions (e.g., to complete all of the questions to characterize the IoT system, to complete a sequence of questions to characterize the IoT system, etc.). The IoT system server may refine and/or update the questions provided (e.g., provide new questions), based on the responses of the user of the user device to previously provided questions and/or to architecture and/or development conflicts. The user of the user device may continue to provide responses to the questions and/or change responses to the previously provided questions, based on the architecture and/or development conflicts identified and/or the solutions provided by the IoT system server. The IoT system server may continue to identify and/or provide solutions to any additional architecture and/or development conflicts that may be identified by IoT system server, until the end of the questions and/or the sequence of questions.

As shown in FIG. 1, and by reference number 5, the IoT system server may provide the IoT system architecture. As shown in FIG. 1, and by reference number 5, the IoT system server may create and/or provide an associated IoT system architecture report, an associated IoT system architecture flow, and/or an associated IoT system architecture guide, using a knowledge-based approach. As shown in FIG. 1, and by reference number 5, the IoT system server may create and/or provide an associated IoT software prototype and/or the IoT system.

A knowledge-based approach includes, among other things, using and/or reusing previously created/obtained material/information (e.g., previously created/obtained IoT system architectures, previously created/obtained IoT system architecture reports, previously created/obtained IoT system architecture flows, previously created/obtained IoT system architecture guides, etc.) that may be relevant to the requirements of the IoT system to save time and resources.

In some implementations, the IoT system server may create and/or provide the IoT system and/or an IoT software prototype based on, for example, the IoT system architecture, the associated IoT system architecture report, the associated IoT system architecture flow, the associated IoT system architecture guide, or the like.

As shown in FIG. 1, and by reference number 6, the user and/or the IoT system server may update a knowledge base by, for example, storing the IoT system architecture for future use, updating best practices, or the like in the IoT system server and/or an IoT system memory. In this way, the IoT system server may automatically create an IoT system architecture based on, for example, previously created/obtained IoT system architectures, previously created/obtained IoT system architecture components, previously created/obtained best practices, or the like, thereby saving the IoT system server's resources and/or processing power.

By using questions and/or a sequence of questions to identify, for example, previously created/obtained IoT system architectures, previously created/obtained IoT system architecture components, or the like, that may be relevant by characterizing the IoT system, changes and testing, based on IoT system architecture requirements may be minimal, thereby reducing a time to deliver the IoT system architecture and/or the IoT system.

Figure 2:
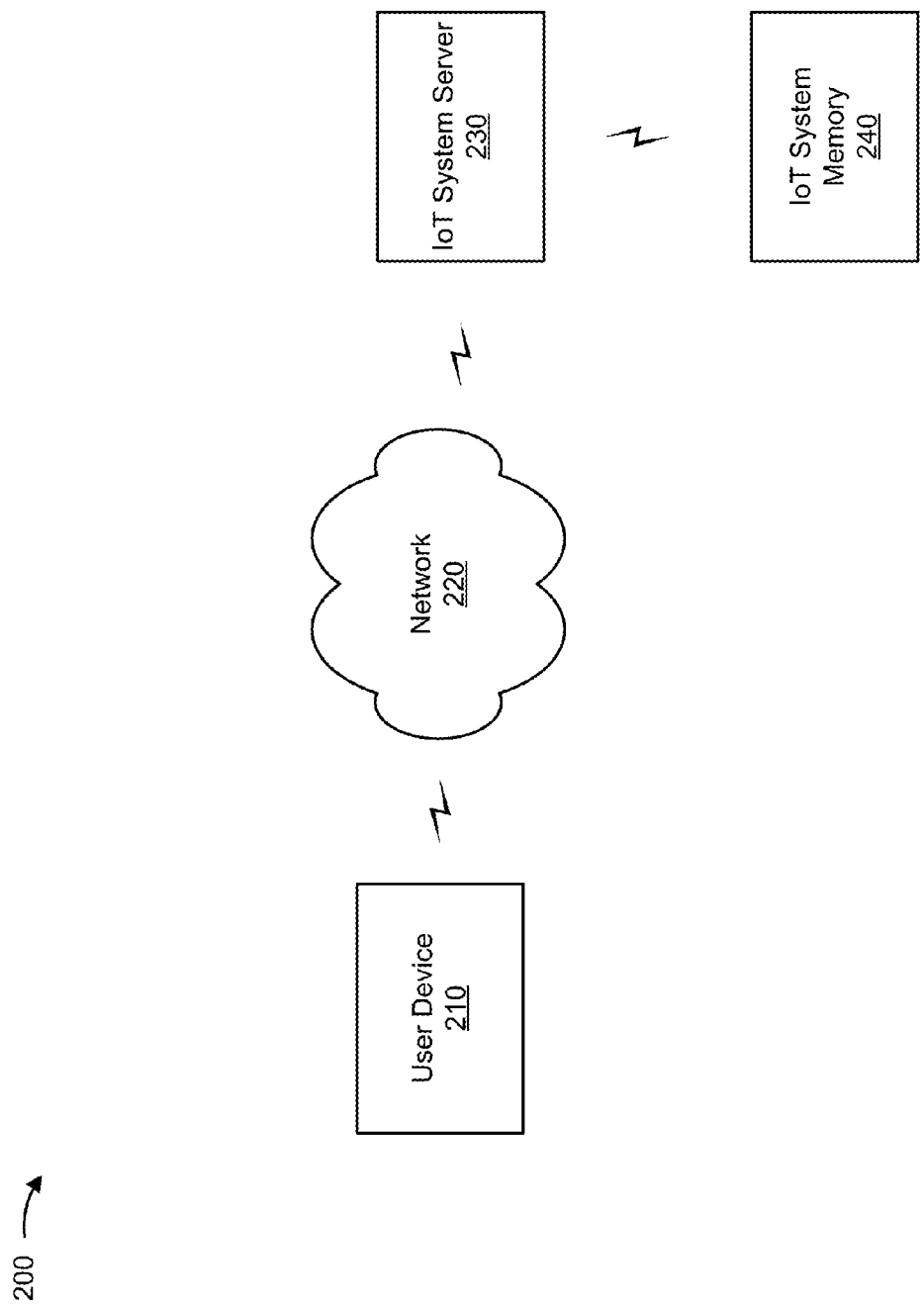
FIG. 2 is a diagram of an example environment in which systems and/or methods, described herein, may be implemented.

FIG. 2 is a diagram of an example environment 200 in which systems and/or methods, described herein, may be implemented. As shown in FIG. 2, environment 200 may include a user device 210, a network 220, an IoT system server 230, and an IoT system memory 240. Devices of environment 200 may interconnect via wired connections, wireless connections, or a combination of wired and wireless connections.

User device 210 may include one or more devices capable of receiving, generating, storing, processing, and/or providing information. For example, user device 210 may include a communication and/or computing device, such as a mobile phone (e.g., a smart phone, a radiotelephone, etc.), a laptop computer, a tablet computer, a handheld computer, a gaming device, a wearable communication device (e.g., a smart wristwatch, a pair of smart eyeglasses, etc.), or a similar type of device. User device 210 may provide responses to questions, provided by IoT system server 230, to characterize an IoT system.

In some implementations, user device 210 may update the responses provided, based on architecture and/or development conflicts, identified by IoT system server 230. In some implementations, user device 210 may provide for display, for example, an IoT system architecture created by IoT system server 230 and/or an associated IoT system architecture report, an associated IoT system architecture flow, an associated IoT system architecture guide, or the like, created by IoT system server 230. In some implementations, user device 210 may receive information from and/or transmit information to another device in environment 200.

Network 220 may include one or more wired and/or wireless networks. For example, network 220 may include a cellular network (e.g., a long-term evolution (LTE) network, a 3G network, a code division multiple access (CDMA) network, etc.), a public land mobile network (PLMN), a local area network (LAN), a wide area network (WAN), a metropolitan area network (MAN), a telephone network (e.g., the Public Switched Telephone Network (PSTN)), a private network, an ad hoc network, an intranet, the Internet, a fiber optic-based network, a cloud computing network, or the like, and/or a combination of these or other types of networks.

IoT system server 230 may include one or more devices capable of storing, processing, and/or routing information. For example, IoT system server 230 may include a server or a group of servers, such as servers associated with a cloud computing environment. IoT system server 230 may provide questions and/or a sequence of questions to user device 210 to characterize the IoT system. In some implementations, IoT system server 230 may provide the question and/or the sequence of questions in a decision tree format, where certain subsequent questions are provided based on a response from a user of user device 210 to a current question provided.

IoT system server 230 may obtain responses by the user of user device 210 to the questions and/or the sequence of questions. IoT system server 230 may create IoT system architecture for the IoT system by applying IoT system architecture rules, based on the responses provided by the user of user device 210. IoT system server 230 may identify architecture and/or development conflicts, by applying IoT system architecture rules, based on the responses from user of user device 210.

IoT system server 230 may provide solutions for the architecture and/or development conflicts identified. IoT system server 230 may create and/or provide an IoT system architecture report and/or an IoT system architecture flow using, for example, a previously created/obtained IoT system architecture, previously created/obtained IoT system architecture components, associated best practices, or the like. IoT system server 230 may update the knowledge base by, for example, storing the IoT system architecture created for future use, updating best practices, or the like in IoT system server 230, IoT system memory 240, and/or another device.

IoT system server 230 may provide user device 210 with a list of existing IoT system profiles. The user of user device 210 may select an existing IoT system profile from the list, associated with a previously created/obtained IoT system architecture and relevant to the IoT system the user of user device 210 seeks to create (e.g., where a characterization of an associated, previously created/obtained IoT system is the same or similar).

IoT system server 230 may obtain/retrieve the previously created/obtained IoT system architecture, associated with the existing IoT system profile, selected by the user of user device 210. IoT system server 230 may modify the previously created/obtained IoT system architecture, to satisfy IoT system requirements for the IoT system, the user of user device 210 seeks to create. IoT system server 230 may create a custom IoT system profile associated with one or more previously created/obtained IoT system architectures. IoT system server 230 may create an IoT system architecture based on the custom IoT system profile. In some implementations, IoT system server 230 may include a communication interface that allows IoT system server 230 to receive information from and/or transmit information to other devices in environment 200.

IoT system memory 240 may include one or more memory devices capable of processing, storing, and/or providing information. In some implementations, IoT system memory 240 may process, store, and/or provide information, such as IoT system architecture rules, IoT system architecture information, best practices information, or the like. IoT system memory 240 may store the IoT system architecture rules, the IoT system architecture information, the best practices information, or the like as a database of information, as a table, as a linked list, or in another form or arrangement of data.

The number and arrangement of devices and networks shown in FIG. 2 are provided as an example. In practice, there may be additional devices and/or networks, fewer devices and/or networks, different devices and/or networks, or differently arranged devices and/or networks than those shown in FIG. 2. Furthermore, two or more devices shown in FIG. 2 may be implemented within a single device, or a single device shown in FIG. 2 may be implemented as multiple, distributed devices. Additionally, or alternatively, a set of devices (e.g., one or more devices) of environment 200 may perform one or more functions described as being performed by another set of devices of environment 200.

Figure 3:
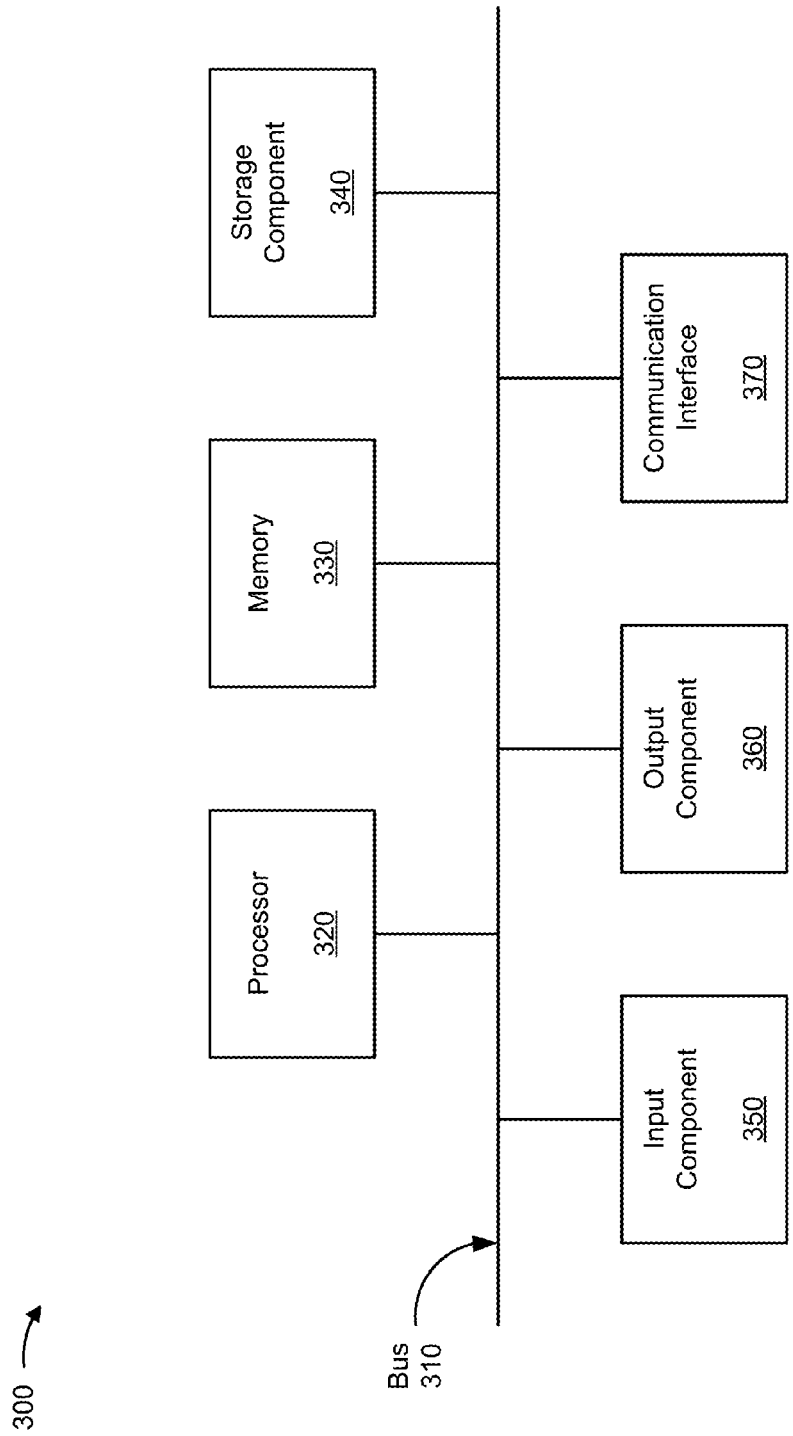
FIG. 3 is a diagram of example components of one or more devices of FIG. 2.

FIG. 3 is a diagram of example components of a device 300. Device 300 may correspond to user device 210, IoT system server 230, and/or IoT system memory 240. In some implementations, user device 210, IoT system server 230, and/or IoT system memory 240 may include one or more devices 300 and/or one or more components of device 300. As shown in FIG. 3, device 300 may include a bus 310, a processor 320, a memory 330, a storage component 340, an input component 350, an output component 360, and a communication interface 370.

Bus 310 may include a component that permits communication among the components of device 300. Processor 320 is implemented in hardware, firmware, or a combination of hardware and software. Processor 320 may include a processor (e.g., a central processing unit (CPU), a graphics processing unit (GPU), an accelerated processing unit (APU), etc.), a microprocessor, and/or any processing component (e.g., a field-programmable gate array (FPGA), an application-specific integrated circuit (ASIC), etc.) that can be programmed to perform a function. Memory 330 may include a random access memory (RAM), a read only memory (ROM), and/or another type of dynamic or static storage device (e.g., a flash memory, a magnetic memory, an optical memory, etc.) that stores information and/or instructions for use by processor 320.

Storage component 340 may store information and/or software related to the operation and use of device 300. For example, storage component 340 may include a hard disk (e.g., a magnetic disk, an optical disk, a magneto-optic disk, a solid state disk, etc.), a compact disc (CD), a digital versatile disc (DVD), a floppy disk, a cartridge, a magnetic tape, and/or another type of computer-readable medium, along with a corresponding drive.

Input component 350 may include a component that permits device 300 to receive information, such as via user input (e.g., a touch screen display, a keyboard, a keypad, a mouse, a button, a switch, a microphone, etc.). Additionally, or alternatively, input component 350 may include a sensor for sensing information (e.g., a global positioning system (GPS) component, an accelerometer, a gyroscope, an actuator, etc.). Output component 360 may include a component that provides output information from device 300 (e.g., a display, a speaker, one or more light-emitting diodes (LEDs), etc.).

Communication interface 370 may include a transceiver-like component (e.g., a transceiver, a separate receiver and transmitter, etc.) that enables device 300 to communicate with other devices, such as via a wired connection, a wireless connection, or a combination of wired and wireless connections. Communication interface 370 may permit device 300 to receive information from another device and/or provide information to another device. For example, communication interface 370 may include an Ethernet interface, an optical interface, a coaxial interface, an infrared interface, a radio frequency (RF) interface, a universal serial bus (USB) interface, a Wi-Fi interface, a cellular network interface, or the like.

Device 300 may perform one or more processes described herein. Device 300 may perform these processes in response to processor 320 executing software instructions stored by a computer-readable medium, such as memory 330 and/or storage component 340. A computer-readable medium is defined herein as a non-transitory memory device. A memory device includes memory space within a single physical storage device or memory space spread across multiple physical storage devices.

Software instructions may be read into memory 330 and/or storage component 340 from another computer-readable medium or from another device via communication interface 370. When executed, software instructions stored in memory 330 and/or storage component 340 may cause processor 320 to perform one or more processes described herein. Additionally, or alternatively, hardwired circuitry may be used in place of or in combination with software instructions to perform one or more processes described herein. Thus, implementations described herein are not limited to any specific combination of hardware circuitry and software.

The number and arrangement of components shown in FIG. 3 are provided as an example. In practice, device 300 may include additional components, fewer components, different components, or differently arranged components than those shown in FIG. 3. Additionally, or alternatively, a set of components (e.g., one or more components) of device 300 may perform one or more functions described as being performed by another set of components of device 300.

Figure 4:
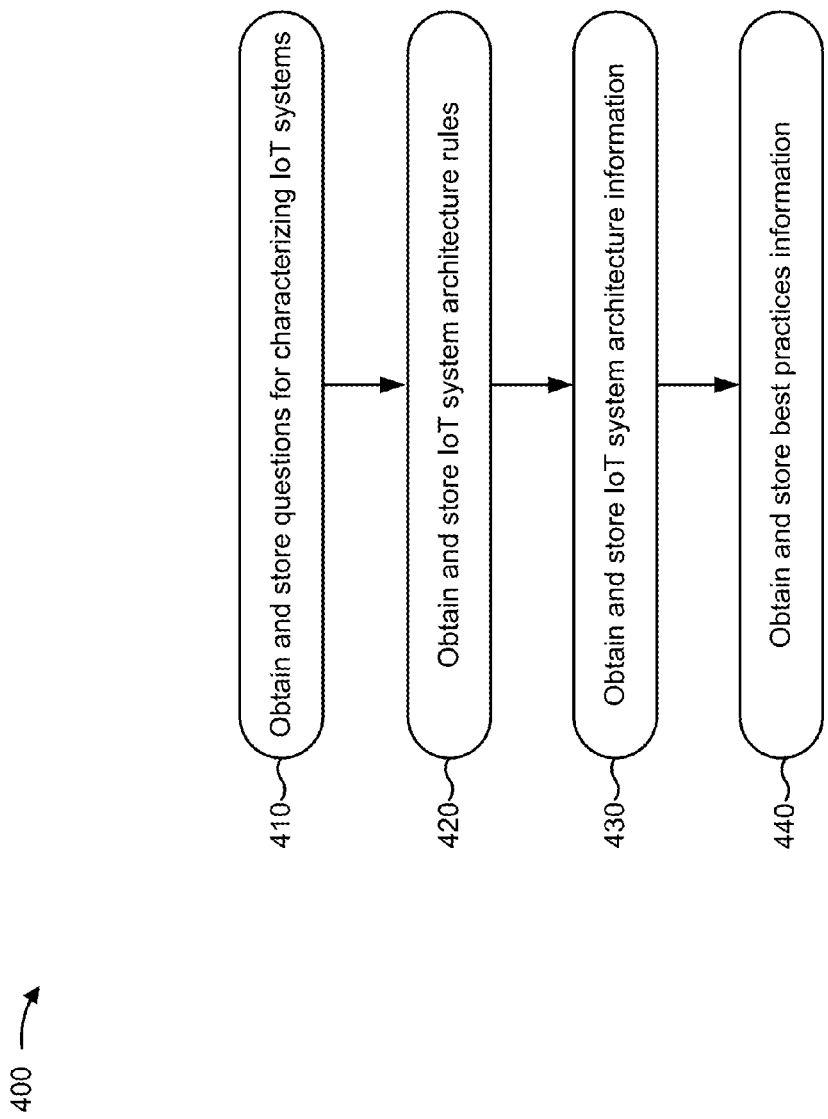
FIG. 4 is a flow chart of an example process for setting up an automated system for creating an IoT system architecture.

FIG. 4 is a flow chart of an example process 400 for setting up an automated system for creating an IoT system architecture. In some implementations, one or more process blocks of FIG. 4 may be performed by IoT system server 230. In some implementations, one or more process blocks of FIG. 4 may be performed by another device or a group of devices separate from or including IoT system server 230, such as user device 210 and IoT system memory 240.

As shown in FIG. 4, process 400 may include obtaining and storing questions for characterizing IoT systems (block 410). For example, IoT system server 230 may obtain questions for characterizing IoT systems, based on various data, to obtain IoT system requirements for the IoT system.

The various data may include characterizing the IoT system based on IoT system information. IoT system information is information about the applications and/or process-services layer of the IoT system architecture. IoT system information may include, for example, a system goal for the IoT system, non-functional requirements for the IoT system, a technology platform for obtaining the system goal for the IoT system, or the like.

A system goal is a high-level functional activity for the IoT system. For example, a system goal may include a sensing functionality, a computing functionality, a visualization functionality, an actuating functionality, or the like. A system goal may be further characterized based on notification information and/or information handling. Notification information is information related to system, server, and/or network monitoring and may identify when system, server, and/or network problems develop (e.g., related to a user action, related to a system event, related to handling updates, etc.). Information handling is information related to performing an action on data (e.g., when/how to access data, when/how to use data, when/how to update data, etc.).

Non-functional requirements are requirements that are not necessary for functionality of the IoT system. Non-functional requirements may include a type of service level agreement, security and/or regulations information, or the like. A technology platform is infrastructure (hardware and/or software) upon which other technologies and/or applications may be built (e.g., an operating system, a cloud-based application/tool such as Xaas, etc.).

The various data may include characterizing the IoT system based on an IoT physical domain. The IoT physical domain describes a physical environment for the IoT system architecture components and/or connectivity information for the IoT system architecture components. Characterizing the IoT physical domain may include characterizing participating entities including, for example, physical devices (e.g., sensors, actuators, gateways, etc.), notifications APIs, control applications, or the like.

Participating entities may be further characterized based on a connectivity protocol used for communication between the participating entities (e.g., Ethernet, wireless fidelity (Wi-Fi), Bluetooth Low Energy, Near Field Communication (NFC), Zigbee, other mesh radio networks, etc.).

Participating entities may also be further characterized based on a connectivity type for the connectivity protocol (e.g., an intermittent connection for the connectivity protocol, a continuous connection for the connectivity protocol, etc.). Participating entities may also be further characterized based on determining the interaction between the IoT system architecture components (e.g., information flow that is events-based, information flow that is on-demand, information flow that is continuous, etc.).

Characterizing the IoT physical domain may also include characterizing the environment disparity within the IoT physical domain. Environment disparity refers to differences (e.g., software and/or hardware differences) between the IoT system architecture components themselves and differences between the IoT system architecture components and other devices/applications, external to the IoT system, that make interconnectivity and seamless interaction between the IoT system architecture components with each other and between the IoT system architecture components and the other devices/applications, challenging.

There may be an environment disparity between, for example, operating systems, application configurations, databases, or the like. Environment disparity may be characterized as homogenous, meaning there is no or a minimal level of an environment disparity, or heterogeneous, meaning there is more than a minimal level of an environment disparity, to present a problem for interconnectivity and/or seamless integration for the IoT system architecture components, during IoT system architecture development.

Characterizing the IoT physical domain may also include characterizing a topology. Topology is an arrangement (i.e., a physical arrangement or a logical arrangement) of various IoT system architecture components within the IoT physical domain. The topology may be static, where the arrangement is fixed, or the topology may be dynamic, where the arrangement is not fixed and may be altered, during a use of the IoT system, based on network demands and/or other factors.

The various data may include characterizing the IoT system based on data management or scalability of data. Data may be characterized based on velocity of the data (e.g., a speed of data into and out of a system). The velocity may be, for example, high velocity, low velocity, or the like. The data may be characterized based on a volume of the data (e.g., an amount of data). The volume may be, for example, high volume, low volume, or the like.

The various data may include characterizing the IoT system based on characterizing human stakeholders. Human stakeholders are select individuals, identified as using and/or interacting with the IoT system, in a significant way. The human stakeholders may be characterized as actors, intermediaries, recipients, or the like.

In some implementations, IoT system server 230 may obtain questions for characterizing IoT systems, based on the various data, from user device 210 and/or another device. In some implementations, the user of user device 210 may create and/or provide an ontology/relationship for the various data for characterizing the IoT system, via user device 210. In some implementations, IoT system server 230 may create an ontology/relationship for the various data for characterizing the IoT system based on IoT system architecture information, including for example, previously created/obtained IoT system architectures, previously created/obtained IoT systems, previously created/obtained best practices, or the like.

In some implementations, IoT system server 230 may create questions, based on the various data, for characterizing the IoT system (e.g., if 'system goal' was provided, as one of the various area for characterizing the IoT system, then IoT system server 230 may create a question, 'What is the system goal?'), to provide to a user of user device 210. In some implementations, IoT system server 230 may use the ontology/relationship for the various data to determine a sequence of questions.

In some implementations, the user of user device 210 may provide a sequence of questions to IoT system server 230 based on the ontology/relationship for the various data. In some implementations, IoT system server 230 may update the various data for characterizing the IoT system, the questions, and/or the sequence of questions based on updates obtained, by IoT system server 230, for the IoT system architecture information (e.g., updates based on a newly created IoT system architecture and/or associated best practices).

In some implementations, IoT system server 230 may store the questions and/or the sequence of questions in IoT system memory 240. In some implementations, IoT system server 230 may store the questions and/or the sequence of questions in another memory device or a collection of memory devices accessible by IoT system server 230.

As shown in FIG. 4, process 400 may include obtaining and storing IoT system architecture rules (block 420). For example, IoT system server 230 may obtain IoT system architecture rules from user device 210 and/or another device. The IoT system architecture rules are predetermined rules that determine which IoT system architecture and/or IoT system architecture components to use to create the IoT system architecture (e.g., a type of application/process-services, a type of physical components, a quantity of physical components, a type of interface layers/protocols, etc.). Determining which IoT system architecture rule to apply is based on characterization of the IoT system.

IoT system architecture rules may be conditional statements (e.g., an if-then construct, an if-then-else construct, etc.) to determine, which application/process-services, physical components, and/or interface layers/protocols to use for the IoT system architecture, based on a way the IoT system is characterized (e.g., if an IoT system is characterized as Characterization A, then IoT system server 230 may create the IoT system architecture using an application/process-service A, based on the IoT system architecture rule 'If <Characterization A> then <Application/process-service A>'; if an IoT system is characterized as Characterization B, then IoT system server 230 may create the IoT system architecture using a physical component B, based on the IoT system architecture rule 'If <Characterization B> then <Physical Component B>'; if an IoT system is characterized as Characterization C, then IoT system server 230 may create the IoT system architecture using an interface layer/protocol C, based on the IoT system architecture rule 'If <Characterization C> then <Interface layer/protocol C>'; etc.).

The IoT system architecture rules may also include, for example, conflict information to identify architecture and/or development conflicts. In some implementations, IoT system server 230 may obtain the IoT system architecture rules by automatically generating the IoT system architecture rules based on, for example, analyzing previously created/obtained IoT system architectures, previously created/obtained IoT system architecture components, and/or previously created/obtained associated best practices, or the like to determine which application/process-services, physical components, and/or interface layers/protocols to use. Additionally, or alternatively, IoT system server 230 may store the IoT system architecture rules automatically created.

In some implementations, IoT system server 230 may obtain the IoT system architecture rules from the user of user device 210, a user of another device, and/or another device. In some implementations, IoT system server 230 may update the IoT system architecture rules based on, for example, previously created/obtained IoT system architecture components and/or associated best practices, updated based on the IoT system architecture components created/obtained.

In some implementations, IoT system server 230 may determine the questions and/or the sequence of questions based on the IoT system architecture rules. For example, IoT system server 230 may create questions based a parameter value for an IoT system architecture rule (e.g., IoT system server 230 may create the question, 'What is the system goal?,' based on a parameter value for 'System Goal' in a general IoT system architecture rule, 'If <System Goal> then <Architecture Component>.'

In some implementations, IoT system server 230 may store the IoT system architecture rules and/or the updated IoT system architecture rules in IoT system memory 240. In some implementations, IoT system server 230 may store the IoT system architecture rules in another memory device or a collection of memory devices accessible by IoT system server 230.

In some implementations, IoT system server 230 may store the questions and/or the sequence of questions, based on the IoT system architecture rules in IoT system memory 240. In some implementations, IoT system server 230 may store the questions and/or the sequence of questions in another memory device or a collection of memory devices accessible by IoT system server 230.

As further shown in FIG. 4, process 400 may include obtaining and storing IoT system architecture information (block 430). For example, IoT system server 230 may obtain IoT system architecture information using an IoT software application (e.g., an IoT System Architecture Builder). IoT system architecture information may include, for example, previously created/obtained IoT system architectures, previously created/obtained IoT system architecture components, previously created/obtained IoT system architecture reports, previously created/obtained IoT system architecture flows, previously created/obtained IoT system architecture guides, best practices associated with IoT system architecture creation and/or IoT system development, previously created/obtained IoT system prototypes, previously created/obtained IoT systems, or the like. In some implementations, IoT system server 230 may receive IoT system architecture information from user device 210 and/or another device.

In some implementations, IoT system server 230 may store the IoT system architecture information in IoT system memory 240. In some implementations, IoT system server 230 may store the IoT system architecture information in another memory device or a collection of memory devices accessible by IoT system server 230.

As further shown in FIG. 4, process 400 may include obtaining and storing best practices information (block 440). For example, IoT system server 230 may receive best practices information from user device 210 and/or another device. Best practices information may include a set of best practices associated with IoT system architecture. A best practice is a technique or methodology that, through experience and research, has proven to reliably lead to a desired result. For example, best practices may include a series of steps to ensure delivery of a high quality IoT system architecture, satisfying desired IoT system requirements (e.g., by using an iterative development process, by managing IoT system requirements, by implementing quality control testing, by monitoring change to code, etc.).

Additionally, or alternatively, the best practices information may include configuration data, documentation, templates, and/or other non-volatile resources to be used in support of utilizing best practices in the development of the IoT system architecture. In some implementations, IoT system server 230 may automatically create best practices information based on analyzing IoT system architecture information.

In some implementations, IoT system server 230 may store the best practices information in IoT system memory 240. In some implementations, IoT system server 230 may store the best practices information in another memory device or a collection of memory devices accessible by IoT system server 230.

Although FIG. 4 shows example blocks of process 400, in some implementations, process 400 may include additional blocks, fewer blocks, different blocks, or differently arranged blocks than those depicted in FIG. 4. Additionally, or alternatively, two or more of the blocks of process 400 may be performed in parallel.

FIGS. 5A-5E are diagrams of an example implementation 500 relating to example process 400 shown in FIG. 4. FIGS. 5A-5E show an example of setting up IoT system architecture rules.

Figure 5A:
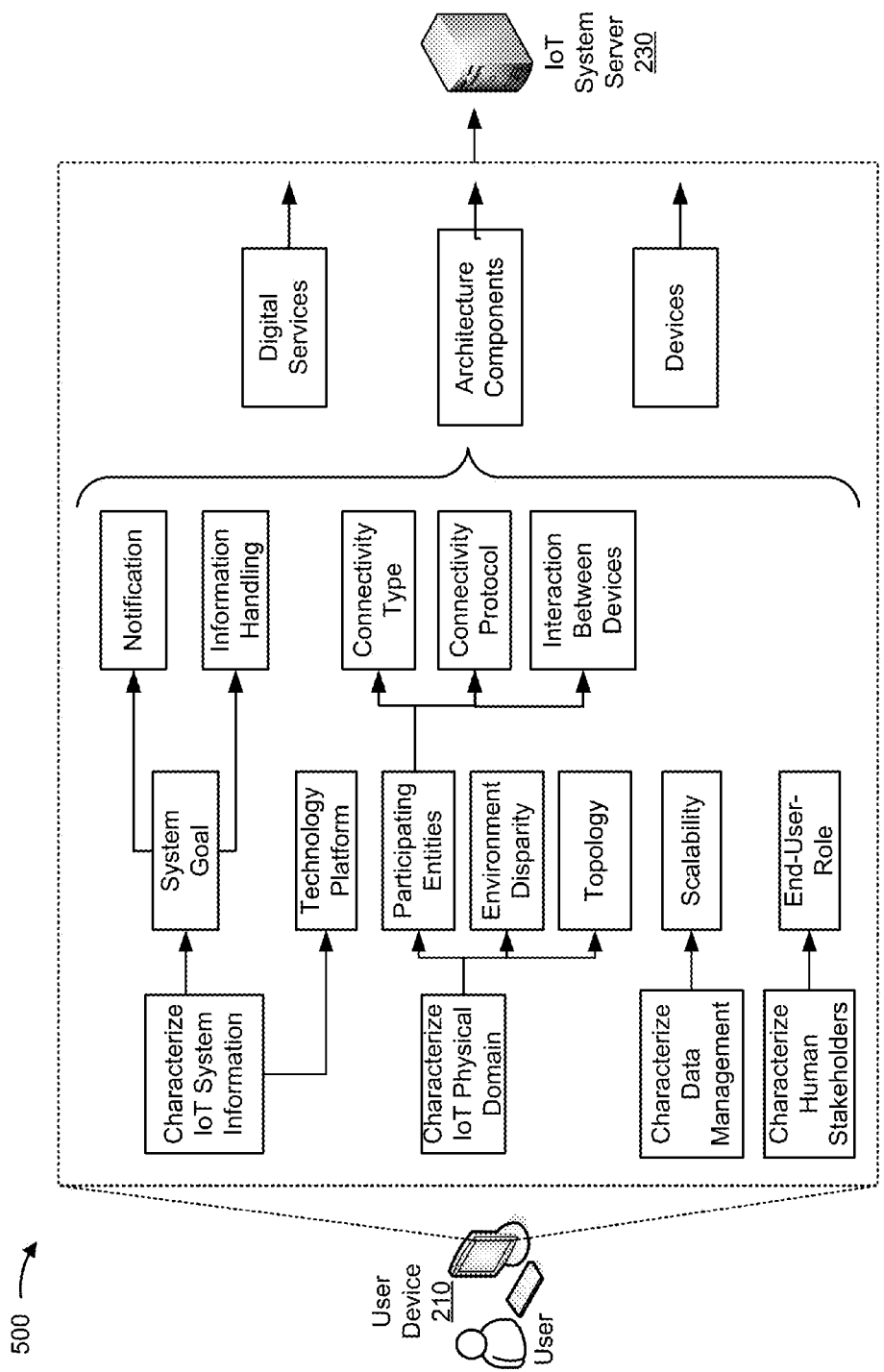
FIGS. 5A-5E are diagrams of an example implementation relating to the example process shown in FIG. 4.

As shown in FIG. 5A, assume a user of user device 210 provides a set of IoT system architecture rules to IoT system server 230. As shown in FIG. 5A, IoT system server 230 obtains an ontology/relationship, for various data for characterizing an IoT system, from the user of user device 210 that IoT system server 230 uses to create a sequence of questions for characterizing an IoT system.

As shown in FIG. 5A, the various data include characterizing IoT system information (e.g., 'Characterize IoT Application Information'). To characterize the IoT system information includes characterizing a system goal (e.g., 'System Goal') and/or a technology platform (e.g., 'Technology Platform'). To characterize the system goal includes characterizing notifications information (e.g., 'Notification') and information handling (e.g., 'Information Handling'), related to the IoT system.

As shown in FIG. 5A, the various data include characterizing an IoT physical domain (e.g., 'Characterize IoT Physical Domain'). To characterize the IoT physical domain includes characterizing participating entities (e.g., 'Participating Entities'), an environment disparity (e.g., 'Environment Disparity'), and/or a topology (e.g., 'Topology'). To characterize the participating entities includes characterizing a connectivity type (e.g., 'Connectivity Type'), a connectivity protocol (e.g., 'Connectivity Protocol') and/or an interaction between devices (e.g., 'Interaction Between Devices').

As shown in FIG. 5A, the various data include characterizing data management (e.g., 'Characterize Data Management'). To characterize the data management includes characterizing scalability (e.g., 'Scalability').

As shown in FIG. 5A, the various data include characterizing human stakeholders (e.g., 'Characterize Human Stakeholders'). To characterize the human stakeholders includes characterizing an end-user role (e.g., 'End-User-Role'). As shown in FIG. 5A, characterization of the various data determines which applications/process-services (e.g., 'Digital Services'), interface layer/protocol (e.g., Architecture Components) and/or physical components (e.g., Devices) IoT system server 230 may select for creating an IoT system architecture.

Figure 5B:
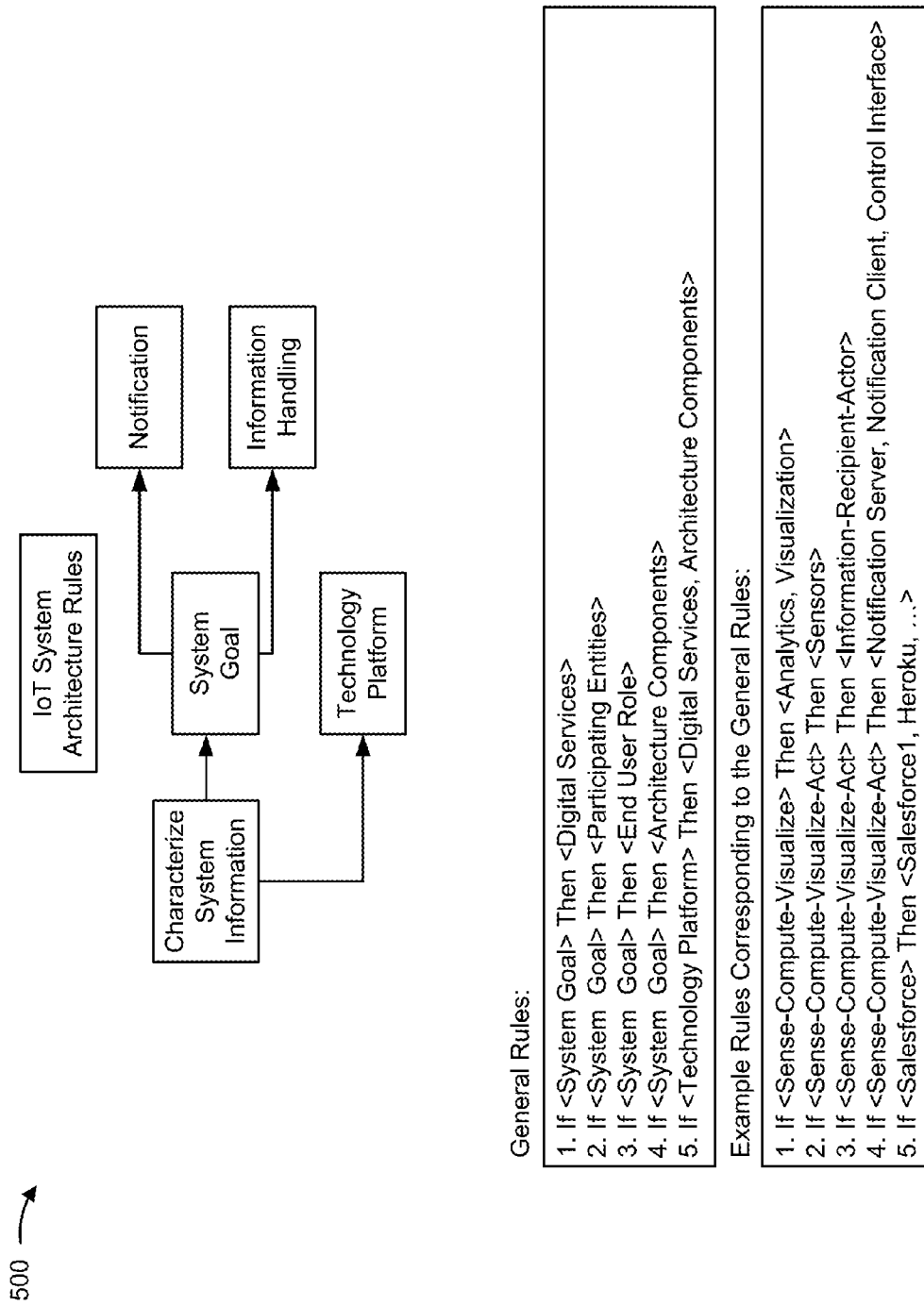

As shown in FIG. 5B, IoT system server 230 creates IoT system architecture rules, based on the various data for characterizing the IoT system, provided by the user of user device 210 using a knowledge-based approach. General rule number 1 provides: If <System Goal> Then <Digital Services>, setting up an 'if-then' construct. Information within brackets are parameters that may have corresponding parameter values. For example, 'System Goal' may equal Goal A, Goal B, Goal C, or the like. 'Digital Services' may be, for example, Service 1, Service 2, Process 1, Process 2, or the like.

As shown in FIG. 5B, example rule number 1, corresponding to general rule number 1, is as follows: If <Sense-Compute-Visualize> Then <Analytics, Visualization>, where the 'System Goal' has a parameter value of 'Sense-Compute-Visualize' and the 'Digital Services' has parameter values of 'Analytics' and 'Visualization.' Example rule number 1, when applied, provides that if the system goal is 'sense-compute-visualize,' then the digital services will include an analytics application (e.g., Analytics) and a visualization application (e.g., Visualization).

As shown in FIG. 5B, general rule number 2 provides: If <System Goal> Then <Participating Entities>. Example rule number 2, corresponding to general rule number 2, is as follows: If <Sense-Compute-Visualize-Act> Then <Sensors>, where the 'System Goal' has a parameter value of 'Sense-Compute-Visualize-Act' and the 'Participating Entities' has a parameter value of 'Sensors.' Example rule number 2, when applied, provides that if the system goal is 'sense-compute-visualize-act,' then the participating entities will include sensors.

As shown in FIG. 5B, general rule number 3 provides: If <System Goal> Then <End User Role>. Example rule number 3, corresponding to general rule number 3, is as follows: If <Sense-Compute-Visualize-Act> Then <Information-Recipient-Actor>, where the 'System Goal' has a parameter value of 'Sense-Compute-Visualize-Act' and the 'End User Role' has a parameter value of 'Information-Recipient-Actor.' Example rule number 3, when applied, provides that if the system goal is 'sense-compute-visualize-act,' then the end user role will include an information-recipient-actor human stakeholder.

As shown in FIG. 5B, general rule number 4 provides: If <System Goal> Then <Architecture Components>. Example rule number 4, corresponding to general rule number 4, is as follows: If <Sense-Compute-Visualize-Act> Then <Notification Server, Notification Client, Control Interface>, where the 'System Goal' has a parameter value of 'Sense-Compute-Visualize-Act' and the 'Architecture Components' has parameter values of 'Notification Server, Notification Client, [and] Control Interface.' Example rule number 4, when applied, provides that if the system goal is 'sense-compute-visualize-act,' then the architecture components will include a notification server, a notification client, and a control interface.

As shown in FIG. 5B, general rule number 5 provides: If <Technology Platform> Then <Digital Services, Architecture Components>. Example rule number 5, corresponding to general rule number 5, is as follows: If <Salesforce> Then <Salesforce1, Heroku, . . . >, where the 'Technology Platform' has a parameter value of 'Salesforce,' the 'Digital Services' has a parameter value of 'Salesforce1,' and the 'Architecture Components' has a parameter value of 'Heroku.' Example rule number 5, when applied, provides that if the technology platform is 'Salesforce,' then the digital service will include Salesforce 1 and the architecture components will include Heroku.

These are some examples of IoT system architecture rules to characterize IoT system information and other IoT system architecture rules are possible.

Figure 5C:
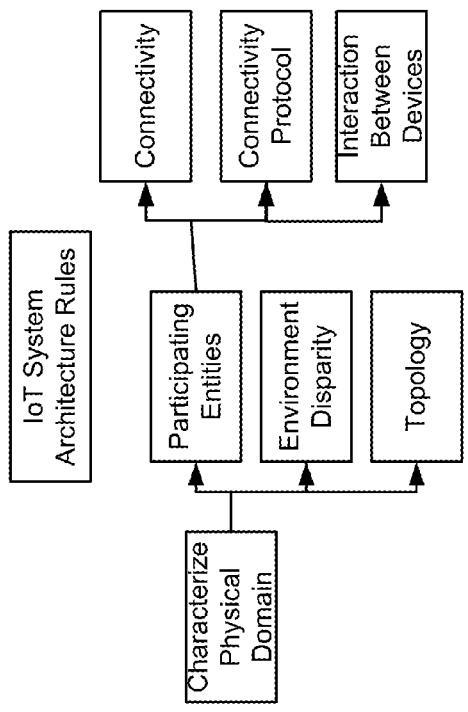

As shown in FIG. 5C, the user of user device 210 provides detailed IoT system architecture rules related to characterizing the IoT physical domain. General rule number 1 provides: If <Connectivity Protocol> Then <Participating Entities>. Example rule number 1, corresponding to general rule number 1, is as follows: If <Local Connectivity> Then <Gateway>, where 'Connectivity Protocol' has a parameter value of 'Local Connectivity' and 'Participating Entities' has a parameter value of 'Gateway.' Example rule number 1, when applied, provides that if the connectivity protocol is of a local connectivity type, then participating entities includes a gateway.

General rule number 2 provides: If <Environment Disparity> Then <Participating Entities>. Example rule number 2, corresponding to general rule number 2, is as follows: If <Heterogeneous Sensor Type> Then <Gateway>, where 'Environment Disparity' has a parameter value of 'Heterogeneous Sensor Type' and 'Participating Entities' has a parameter value of 'Gateway.' Example rule number 2, when applied, provides that if the environment disparity is of a heterogeneous sensor type, then the participating entities include a gateway.

General rule number 3 provides: If <Topology> Then <Connectivity Protocol, Participating Entities, Architecture Components>. Example rule number 3, corresponding to general rule number 3, is as follows: If <Dynamic> Then <Internet Enabled, Sensors, Data Ingestion-Pub Sub>, where 'Topology' has a parameter value of 'Dynamic' and 'Connectivity Protocol, Participating Entities, Architecture Components' have parameter values of 'Internet Enabled, Sensors, Data Ingestion-PubSub.' Example rule number 3, when applied, provides that if the topology is of a dynamic type, then the connectivity protocol is of an internet enabled type, the participating entities include sensors, and the architecture components include data ingestion using a pub-sub engine.

General rule number 4 provides: If <Connectivity> Then <System Goal> Impacted. Example rule number 4, corresponding to general rule number 4, is as follows: If <Intermittent Connectivity> Then <Sense-Compute-Visualize-Act> Impacted, where 'Connectivity' has a parameter value of 'Intermittent Connectivity' and 'System Goal' has a parameter value of 'Sense-Compute-Visualize-Act.' Example rule number 4, when applied, provides that if the connectivity is of an intermittent connectivity type, then the system goal of 'sense-compute-visualize-act' is impacted. These are some examples of IoT system architecture rules to characterize an IoT physical domain and/or identify an architecture and/or decision conflict, and other IoT system architecture rules are possible.

Figure 5D:
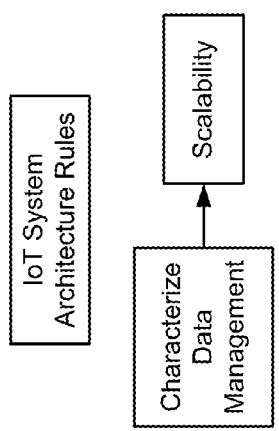

As shown in FIG. 5D, the user of user device 210 provides a detailed IoT system architecture rule related to characterizing data management. General rule number 1 provides: If <Scalability (Data)> Then <Architecture Components>. Example rule number 1, corresponding to general rule number 1, is as follows: If <Low velocity-low volume> Then <Data Ingest (Direct Rest)>, where 'Scalability (Data)>' has a parameter value of 'Low velocity-low volume' and 'Architecture Components' has a parameter value of 'Data Ingest (Direct Rest)>.' Example rule number 1, when applied, provides that if the data is of low velocity and of low volume, then the architecture component is of a data ingestion (Direct Rest) type. These are some examples of IoT system architecture rules to characterize data management and other IoT system architecture rules are possible.

Figure 5E:
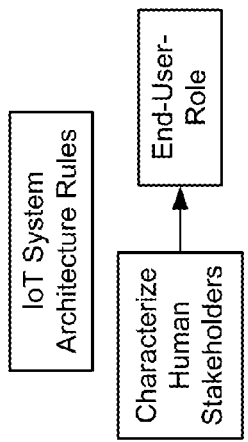

As shown in FIG. 5E, the user of user device 210 provides a detailed IoT system architecture rule related to characterizing human stakeholders. General rule number 1 provides: If <End-User-Role> Then <Architecture Components, Apps, Digital Services>. Example rule number 1, corresponding to general rule number 1, is as follows: If <Intermediary> Then <Notification Server, Notification Client, End-User App, Process-Management>, where 'End-User-Role' has a parameter value of 'Intermediary,' 'Architecture Components' has a parameter value of 'Notification Server,' 'Apps' have parameter values of 'Notification Client' and 'End-User App,' and 'Digital Services' has a parameter value of 'Process-Management.'

Example rule number 1, when applied, provides that if the end-user-role is of the intermediary type, then the architecture components include a notification server, the applications include a notification client and an end-user application, and the digital services include a process management service. This is an example of IoT system architecture rules to characterize human stakeholders and other IoT system architecture rules are possible.

As indicated above, FIGS. 5A-5E are provided merely as an example. Other examples are possible and may differ from what was described with regard to FIGS. 5A-5E.

Figure 6A:
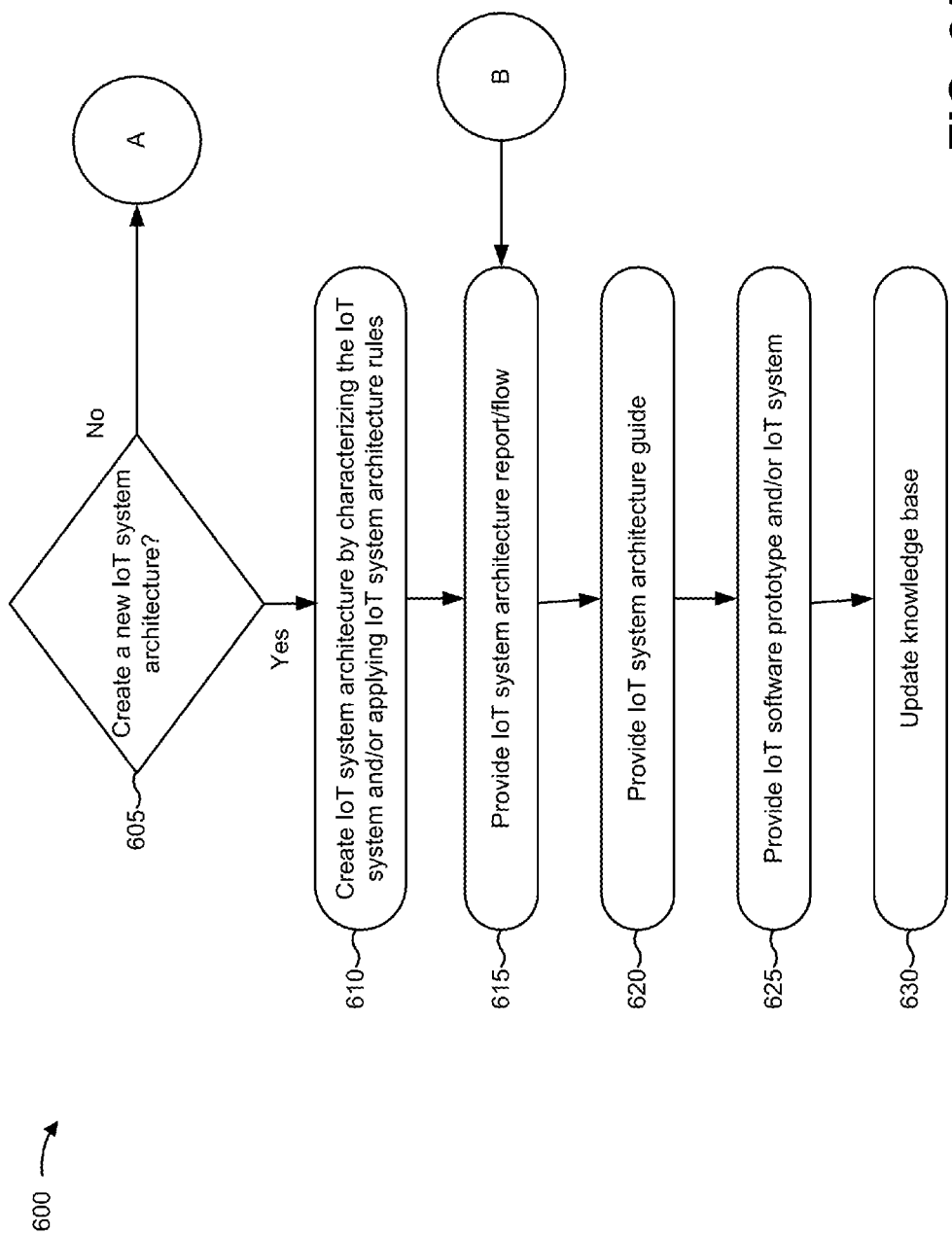
FIGS. 6A and 6B are flow charts of an example process for using an automated system for creating an IoT system architecture.
Figure 6B:
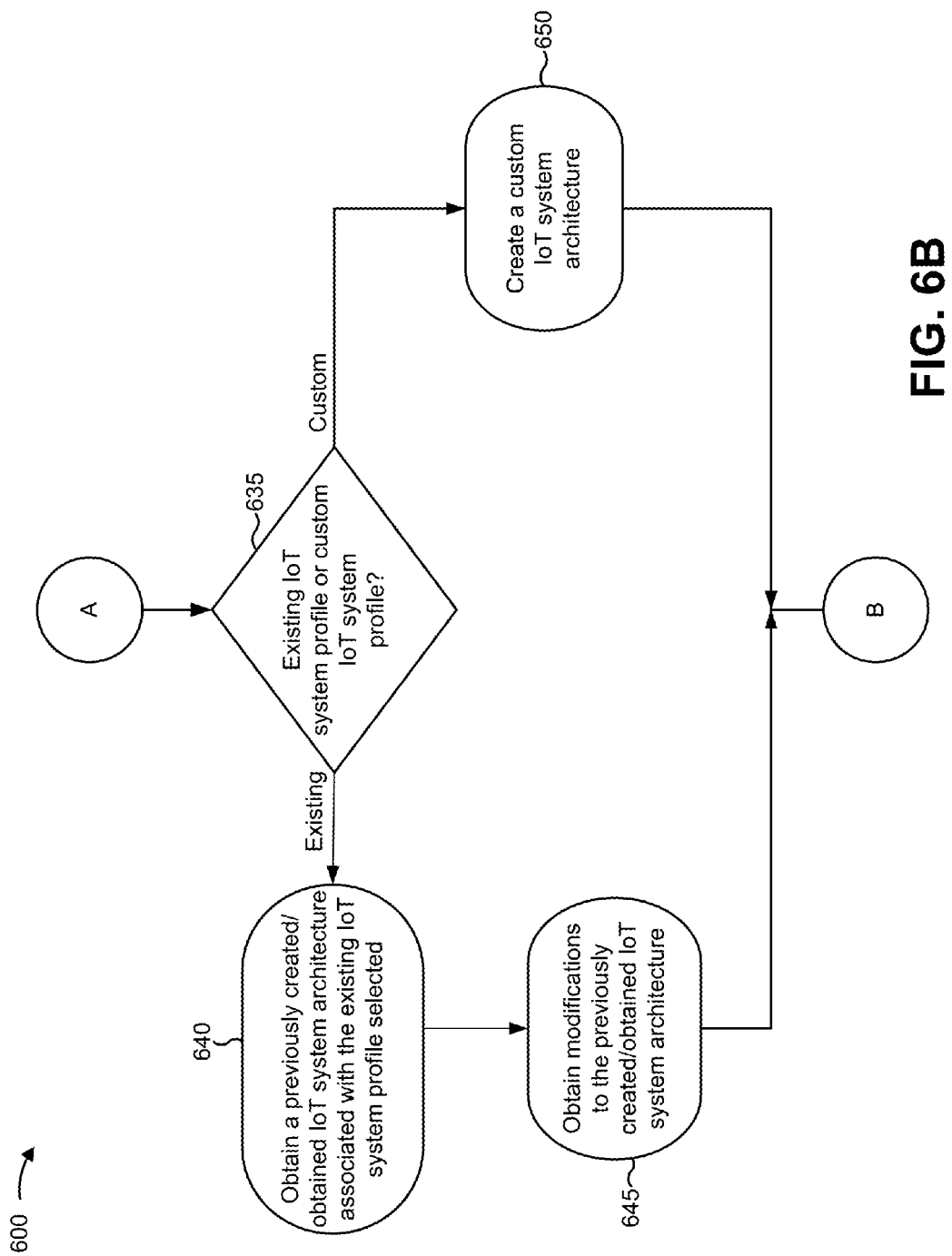

FIGS. 6A and 6B are flow charts of an example process 600 for using an automated system for creating an IoT system architecture. In some implementations, one or more process blocks of FIGS. 6A and 6B may be performed by IoT system server 230. In some implementations, one or more process blocks of FIGS. 6A and 6B may be performed by another device or a group of devices separate from or including IoT system server 230, such as user device 210 and IoT system memory 240.

As shown in FIG. 6A, process 600 may include determining whether to create a new IoT system architecture (block 605). For example, IoT system server 230 may provide a question to a user of user device 210, via an IoT software application (e.g., an IoT System Architecture Builder) provided on user device 210 and associated with IoT system server 230, to determine whether the user of user device 210 seeks to create a new IoT system architecture for an IoT system (e.g., an IoT patient heart monitoring system).

If the user of user device 210 responds that the user of user device 210 seeks to create a new IoT system architecture, then IoT system server 230 may provide questions and/or a sequence of questions, related to characterizing the IoT system to create the new IoT system architecture. If the user of user device 210 responds that the user does not seek to create a new IoT system architecture, then IoT system server 230 may provide a selection to user device 210 between using an existing IoT system profile or creating a custom IoT system profile, as discussed in detail below.

As further shown in FIG. 6A, if the user of user device 210 seeks to create a new IoT system architecture (block 605—Yes), process 600 may include creating an IoT system architecture by characterizing the IoT system and/or applying IoT system architecture rules (block 610). For example, IoT system server 230 may provide questions and/or a sequence of questions (e.g., a linear sequence, a decision tree format, etc.) to a user of user device 210, via the IoT software application, to characterize the IoT system, (e.g., a system goal, a technology platform, connectivity, scalability, end-user-role, etc.).

The questions and/or the sequence for the questions, to characterize the IoT system, may be developed based on IoT system architecture information (e.g., architecture knowledge, system profiles, etc.) and/or associated best practices information. For example, IoT system server 230 may provide questions, for example, 'What is a system goal desired?,' 'What is a technology platform desired?,' 'What is an intended connectivity type?,' or the like.

Additionally, or alternatively, IoT system server 230 may continue to provide the questions and/or the sequence of questions until the questions and/or the sequence of questions are complete. In some implementations, the sequence for the questions may be determined based on the response of the user of the user device 210 to a current question. For example, if the user of the user device provides that the 'System Goal' is 'sensing' but not 'actuating,' the IoT system server 230 may provide a follow-up question related to what types of data may require sensing by the IoT system (e.g., touch data, geographic information data, water level/quality data, etc.).

Additionally, or alternatively, IoT system server 230 may obtain a response by the user of user device 210 (e.g., the system goal for the IoT system is Goal A, the technology platform for the IoT system is Technology Platform B, the connectivity type for the IoT system is Connectivity Type C, etc.). In some implementations, IoT system server 230 may obtain the response as an input from the user of user device 210. In some implementations, IoT system server 230 may provide a list of candidate responses for display on user device 210. Additionally, or alternatively, the user of user device 210 may select a response from the list of candidate responses, characterizing the IoT system. Additionally, or alternatively, IoT system server 230 may receive the response selected.

Additionally, or alternatively, IoT system server 230 may compare the response provided from the user of user device 210 to stored parameter values associated with 'if' statements (e.g., 'If <Goal A>', 'If <Technology Platform B>,' 'If <Connectivity Type C>,' etc.) of the IoT system architecture rules (e.g., 'If <Goal A>', then <Application A>;' 'If <Technology Platform B>, then <Notification Server API B>;' 'If <Connectivity Type C>, then <Data Store C>,' etc.).

If the response provided from the user of user device 210 matches one of the stored parameter values associated with the 'if' statements of the IoT architecture rules, then IoT system server 230 may execute an associated 'then' statement to create the IoT system architecture and/or IoT system architecture component (e.g., if user of user device 210 provides a response that the system goal is Goal A, then IoT system server 230 executes the associated 'then' statement, 'then <Application A>,' to create an IoT system architecture including Application A, based on the response=Goal A matching the stored parameter value of the 'if' statement, 'If <Goal A>,' if user of user device 210 provides a response that the technology platform is Technology Platform B, then IoT system server 230 executes the associated 'then' statement, 'then <Notification Server API B>,' to create an IoT system architecture including Notification Server API B, based on the response=Technology Platform B matching the stored parameter value of the 'if' statement, 'If <Technology Platform B>;' if user of user device 210 provides a response that the connectivity type is Connectivity Type C, then IoT system server 230 executes the associated 'then' statement, 'then <Data Store C>,' to create an IoT system architecture including Data Store C, based on the response=Connectivity Type C matching the stored parameter value of the 'if' statement, 'If <Connectivity Type C>,' etc.).

If the response provided from the user of user device 210 does not match one of the stored parameter values associated with the 'if' statements, then IoT system server 230 may provide a notification for display on user device 210 (e.g., 'System goal provided is not recognized.'). In some implementations, IoT system server 230 may prompt the user of user device 210 to provide another response (e.g., 'Provide another valid system goal'). In some implementations, IoT system server 230 may permit the response but provide a notification for display on user device 210 that the response provided by the user of user device 210 may require a new IoT system architecture component satisfying IoT system requirements created by the response (e.g., 'Warning—system goal provided is new—new IoT system architecture component needs to be created').

Additionally, or alternatively, IoT system server 230 may identify architecture and/or development conflicts based on IoT system server 230 applying an IoT system architecture rule, related to architecture and/or development conflicts, based on the response of the user of user device 210. For example, the IoT system architecture rule, related to an architecture and/or development conflict, may provide 'If <System Goal A> then <Architecture Component A> Impacted.' If the user of user device 210 provides a response that 'System Goal' is 'Goal A,' then IoT system server 230 may identify an architecture and/or development conflict (e.g., 'System Goal A provided impacts Architecture Component A').

In some implementations, IoT system server 230 may continue to provide questions, based on the responses of the user of user device 210 to previously provided questions, following a decision tree format as previously described. Additionally, or alternatively, IoT system server 230 may continue to obtain responses from the user of user device 210 to the questions provided. In some implementations, IoT system server 230 may obtain updated responses based on the architecture and/or development conflicts identified.

In some implementations, IoT system server 230 may provide a question asking whether the user of user device 210 seeks to update a previously provided response based on the architecture and/or development conflicts identified. In some implementations, IoT system server 230 may obtain an update to a previously provided response without a prompt from IoT system server 230.

In some implementations, IoT system server 230 may determine and/or provide a solution to the architecture and/or development conflict identified, based on analyzing previously created/obtained IoT system architecture and/or other IoT system architecture information, including best practices information (e.g., search for a similar architecture and/or development conflict and use an associated IoT system architecture solution for the architecture and/or development conflict identified).

In some implementations, IoT system server 230 may provide a question asking whether the user of user device 210 seeks to update a previously provided response based on the solution provided. In some implementations, IoT system server 230 may obtain an update to a previously provided response, based on the solution provided, without a prompt from IoT system server 230.

Additionally, or alternatively, IoT system server 230 may continue to identify architecture and/or development conflict and/or provide solutions, until the questions and/or sequence of questions are complete (e.g., all the questions, all the questions in a particular sequence, all the questions based on following a path on a decision tree, etc.).

As further shown in FIG. 6A, process 600 may include providing an IoT system architecture report/flow (block 615). For example, IoT system server 230 may analyze the one or more responses provided by the user of user device 210. Additionally, or alternatively, IoT system server 230 may create an IoT system architecture report based the one or more responses provided by the user of user device 210.

The IoT system architecture report may include, for example, the IoT system architecture. The IoT system architecture report may include a list of architecture decisions and/or components recommended by IoT system server 230, based on applying IoT system architecture rules, to the one or more responses obtained from user device 210, to create the IoT system architecture (e.g., a type of sensor, a quantity of sensors, a location at which a sensor is to be placed, a type of actuator, a quantity of actuators, a location at which an actuator is to be placed, a notification server API, etc.). The IoT system architecture report may include a list of tasks, for development for the user of user device 210 and/or another developer for building the IoT system, based on the IoT system architecture (e.g., a list of custom services and applications, a list of modifications required to commercial-off-the-shelf (COTS) products to meet the IoT system architecture, etc.).

The IoT system architecture report may include a list of considerations for the user of user device 210 and/or another developer of the IoT system. The list of considerations may include architecture and/or development conflicts based on the responses of the user of user device 210 (e.g., 'System Goal A provided impacts Architecture Component A').

The IoT system architecture report may include a list of further decisions for the user of user device 210 (e.g., using another service programming platform, using the IoT system architecture for a different IoT system, etc.). The IoT system architecture report may be formatted, for example, in a table, as a radar plot, or the like.

Additionally, or alternatively, IoT system server 230 may create an IoT system architecture flow (e.g., a visual flow modeling framework), using IoT system architecture components and interconnectivity information, provided by the IoT system architecture for modeling the IoT system architecture flow. The IoT system architecture flow may represent the IoT system architecture components as functional blocks, with underlying source code, to perform functionality for the IoT system architecture components, as provided by the IoT system architecture.

Additionally or alternatively, IoT system server 230 may provide the IoT system guide to user device 210 and/or another device.

As further shown in FIG. 6A, process 600 may include providing an IoT system architecture guide (block 620). For example, IoT system server 230 may create an IoT system architecture guide, for IoT system developers to build the IoT system, based on the IoT system architecture provided in the IoT system architecture report. IoT system server 230 may analyze the IoT system architecture and/or the IoT system architecture report, using IoT system software, to provide guidance using architecture ptinciples, design principles, and/or patterns previously tested and improved (e.g., based on best practices information). The IoT system architecture guide may include the guidance using architecture principles, design principles, and/or patterns previously tested and improved.

Additionally, or alternatively, IoT system server 230 may analyze the IoT system architecture and/or the IoT system architecture report, using IoT system software, to identify appropriate strategies and design patterns for helping design the IoT system's layers, components, and services, for example, based on the IoT system architecture, the IoT system architecture report, previously created/obtained IoT system architecture information and/or best practices information relevant to the IoT system architecture. The IoT system architecture guide may include the appropriate strategies and design patterns identified.

Additionally, or alternatively, IoT system server 230 may analyze the IoT system architecture and/or the IoT system architecture report, using IoT system software, to identify and/or address key engineering decision points, based on the IoT system architecture, the IoT system architecture report, previously created/obtained IoT system architecture information, and/or best practices information relevant to the IoT system architecture. The IoT system architecture guide may include the key engineering decision points identified and/or addressed.

Additionally, or alternatively, IoT system server 230 may analyze the IoT system architecture and/or the IoT system architecture report, using IoT system software, to select appropriate technology using previously obtained and/or stored best practices information relevant to the IoT system architecture and/or the IoT system architecture report. The IoT system architecture guide may include the appropriate technology chosen. Additionally, or alternatively, IoT system server 230 may analyze the IoT system architecture and/or the IoT system architecture report, using IoT system software, to identify practice solution, assets, and/or further guidance for creating the IoT system using previously obtained and/or stored best practices information relevant to the IoT system architecture and/or the IoT system architecture report. The IoT systemarchitecture guide may include the practice solution, assets, and/or the further guidance.

Additionally, or alternatively, IoT systemserver may 230 provide the IoT system auide to user device 210 and/or another device.

As further shown in FIG. 6A, process 600 may include providing an IoT software prototype and/or IoT system (block 625). For example, IoT system server 230 may use the IoT system architecture and/or the associated IoT system architecture flow as a template for code to automatically build out the IoT software prototype. The template for the IoT software prototype may be automatically populated using IoT system architecture information identified for reuse and/or other newly created IoT system architecture components.

In some implementations, IoT system server 230 may analyze the associated IoT system architecture report, the associated IoT system architecture guide, and/or the associated best practices to further develop the template and/or automatically populate the template for the IoT software prototype. In some implementations, IoT system server 230 may use programming languages, such as HTML, CSS, or JavaScript to build and/or compile the IoT software prototype. In some implementations, a user of user device 210 may build the IoT software prototype, using user device 210 and/or another device.

In some implementations, IoT system server 230 may build the IoT system, based on the IoT software prototype, with a fully working database and/or IoT physical devices, ready for final testing and validation. In some implementations, a build-out for the IoT system may be automated. For example, IoT system server 230 may use an integrated set of software coding tools that use, for example, the IoT software prototype as a template to create source code programs for the build-out of the IoT system. Additionally, or alternatively, IoT system server 230 may use the integrated set of software coding tools to create one or more databases. Additionally, or alternatively, IoT system server 230 may use the integrated set of software coding tools to populate the one or more databases. In some implementations, a user of user device 210 may build the IoT system using user device 210 and/or another device.

Additionally, or alternatively, IoT system server 230 may provide the IoT software prototype and/or the IoT system to user device 210 and/or another device or system.

As further shown in FIG. 6A, process 600 may include updating a knowledge base (block 630). For example, IoT system server 230 may update a knowledge base of the IoT system server by storing and/or updating, for example, the IoT system architecture, the associated IoT system architecture report, the associated IoT system architecture flow, the associated IoT system architecture guide, or the like, created for the IoT system in IoT system server 230, IoT system memory 240, and/or another device.

Additionally, or alternatively, a user of IoT system server 230 may update the knowledge base by updating the best practices information, based on information learned and/or best practices developed based on creating the IoT system architecture, the IoT software prototype, and/or the IoT system. In some implementations, IoT system server 230 may automatically update the best practices information without input from the user of user device 210. Additionally, or alternatively, IoT system server 230 may update the knowledge base by storing the updated best practices information in the IoT system server 230, IoT system memory 240, and/or another device as shown in FIG. 6A, if the user of user device 210 does not seek to create a new IoT system architecture (block 605—No), process 600 may include determining whether the user of user device 210 seeks to use an existing IoT system profile or a custom IoT system profile (FIG. 6B, block 635). For example, IoT system server 230 may provide a question to a user of user device 210 for display, via the IoT software application, to determine whether the user of user device 210 seeks to use an existing IoT system profile or a custom IoT system profile.

An existing IoT system profile is associated with a previously created/obtained IoT system architecture associated with the IoT system architecture. The existing IoT system profile may provide relevant information, about a previously created/obtained IoT system architecture and/or an associated IoT system, to assist a user of user device 210 understand a subject matter and/or functionality of the IoT system architecture and/or the IoT system. The relevant information may include, for example, a name of the IoT system, the name of an IoT system architecture, an implementation for the IoT system, or the like.

A user of user device 210 may access the relevant information (e.g., the existing IoT system profile may include a name of an IoT system as 'Smart Home') and obtain an understanding of the functionality/use of the previously created/obtained IoT system architecture and/or the associated, previously created/obtained IoT system (e.g., a title for the previously created/obtained IoT system is 'Smart Homes' and the user of user device 210 may understand that the existing IoT system profile is about IoT devices used in IoT-enabled homes).

The existing IoT system profile may identify information, relevant to a user of user device 210, to determine whether to create a new IoT system architecture or whether an existing IoT system architecture may satisfy current IoT system requirements for the IoT system. For example, the user of user device 210 may seek to create an IoT system architecture for an IoT home security system and may determine from the title of the existing IoT system profile, 'Smart Homes,' that the previously created/obtained IoT system architecture, associated with the IoT system profile, may be relevant. The user of user device 210 may determine that using the previously created/obtained IoT system architecture, associated with the existing IoT system profile, may conserve time and resources rather than creating a new IoT system architecture.

A custom IoT system profile is not directly associated with any one IoT system and/or any one IoT system architecture. The user of user device 210 may create a custom IoT system profile by providing information to IoT system server 230. The information may include, for example, an IoT device type (e.g., an IoT door sensor), an implementation for the IoT device type (e.g., using the IoT door sensor in an IoT home security system), or the like.

In some implementations, IoT system server 230 may provide a list of existing IoT system profiles, stored in IoT system server 230, IoT system memory 240, and/or another device, to user device 210 for display to assist a user of user device 210 in determining whether to access/use an existing IoT system profile or to create a custom IoT system profile. In some implementations, IoT system server 230 may provide a list of existing IoT system profiles to user device 210 for display to assist a user of user device 210 in determining whether to access/use an existing IoT system profile, create a custom IoT system profile, and/or create a new IoT system architecture, while determining whether to create a new IoT system architecture discussed above. In some implementations, IoT system server 230 may create and/or store a new IoT system profile associated with the IoT system architecture created.

In some plementations, foT system server 230 may use a tool (e.g., a software wizard or setup assistant) to piovide a user interface, for user device 210, that presents the user of user device 210 with a sequence of dialog boxes that may lead the user of user device 210 through a series of well-defined steps including, for example, enabling the user of user device 210 to use a previously created/obtained IoT system architecture associated with an existing IoT system profile or create an IoT system architecture based on creating a custom IoT system profile. In some implementations, the tool may also be used to create a new IoT system architecture for an IoT system, as discussed above.

If the user of user device 210 selects to use an existing IoT system profile (e.g., an existing IoT system profile similar/relevant to the IoT system the user of user device 210 seeks to create), then IoT system server 230 may retrieve a previously created/obtained IoT system architecture, associated with the existing IoT system profile, selected by the user of user device 210. If the user of user device 210 selects using a custom IoT system profile, then the user of user device 210 may create a custom IoT system profile.

As further shown in FIG. 6B, if the user of user device 210 selects an existing IoT system profile (block 635—Existing), process 600 may include obtaining a previously created/obtained IoT system architecture associated with the existing IoT system profile selected (block 640). For example, IoT system server 230 may obtain a previously created/obtained IoT system architecture associated with the existing IoT system profile, selected by the user of user device 210, by retrieving a previously created/obtained IoT system architecture associated with the existing IoT system profile and stored by user device 210, IoT system server 230, IoT system memory 240, and/or another device. Additionally, or alternatively IoT system server 230 may provide the previously created/obtained IoT system architecture for display on user device 210.

As further shown in FIG. 6B, process 600 may include obtaining modifications to the previously created/obtained IoT system architecture (block 645). For example, IoT system server 230 may receive modifications (e.g., based on best practices), from a user of user device 210, to the existing IoT system architecture, based on the IoT system requirements.

In some implementations, IoT system server 230 may obtain the IoT system requirements from user device 210. Additionally, or alternatively, IoT system server 230 may analyze the IoT system requirements using analytic software. Additionally, or alternatively, IoT system server 230 may automatically perform the modifications based on the IoT system requirements using, for example, the IoT system architecture rules, the IoT system architecture information, best practices information, or the like (e.g., using software to analyze the IoT system requirements and perform the modifications, as determined by the IoT system requirements using, for example, IoT system rules, the IoT system architecture information, best practices information, or the like).

As further shown in FIG. 6B, if the IoT system profile is a custom IoT system profile (block 635—Custom), process 600 may include creating a custom IoT system architecture (block 650). For example, IoT system server 230 may present, for display, various questions to characterize a custom IoT system profile (e.g., 'What is an IoT device type the user seeks to use?'; 'What is an IoT system the user seeks to create?'; etc.). Additionally, or alternatively, IoT system server 230 may obtain one or more previously created/obtained IoT system architectures and/or IoT system architecture components, matching characterization of the custom IoT system profile, based on responses to the various questions. Additionally, or alternatively, IoT system server 230 may create a custom IoT system architecture based on the one or more previously created/obtained IoT system architectures and/or IoT system architecture components.

Although FIGS. 6A and 6B show example blocks of process 600, in some implementations, process 600 may include additional blocks, fewer blocks, different blocks, or differently arranged blocks than those depicted in FIGS. 6A and 6B. Additionally, or alternatively, two or more of the blocks of process 600 may be performed in parallel.

FIGS. 7A-7L are diagrams of an example implementation 700 relating to example process 600 shown in FIGS. 6A and 6B. FIGS. 7A-7L show an example of using an automated system for creating an IoT system architecture.

Figure 7A:
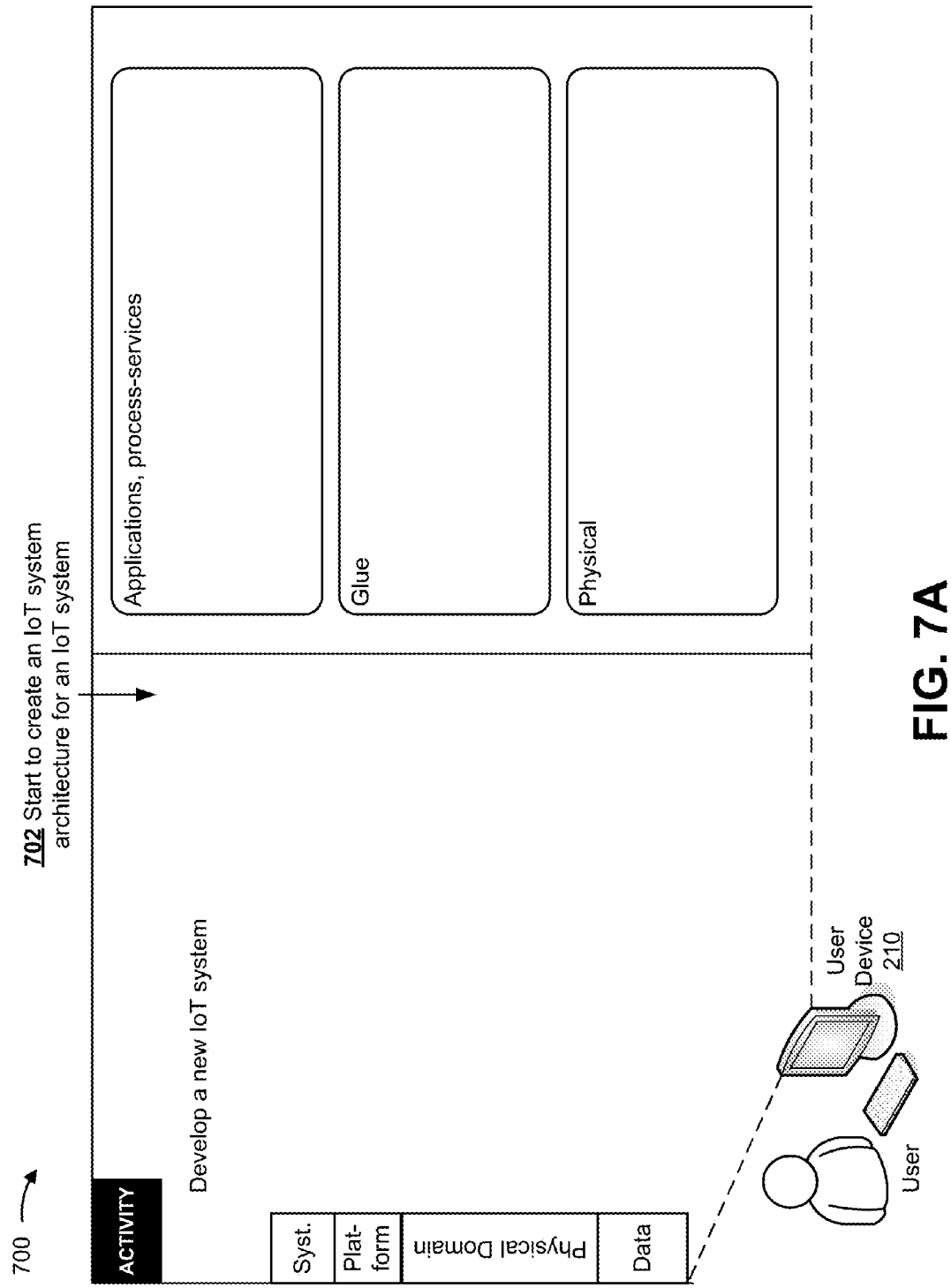

As shown in FIG. 7A, assume a user (e.g., User) of a user device (e.g., user device 210) seeks to create a new IoT system architecture for an IoT system (e.g., the user is an IoT system developer and seeks to create a new IoT system architecture for an IoT-enabled server rack monitoring system, which is a system for using IoT sensors and/or other devices, located on server racks for detecting, for example, voltage, current, energy, power, or the like). Assume the user of user device 210 may use an IoT software application (e.g., an IoT System Architecture Builder), provided on user device 210, to create the new IoT system architecture. Assume the user of user device 210 interacts with an interface for the IoT software application, provided by user device 210 and associated with an IoT system server 230 (e.g., IoT system server 230). Assume the user of user device 210 uses the IoT software application to characterize the IoT system to create an IoT system architecture, by creating IoT system architecture components, including applications/process-services (e.g., Applications/process-services), interface layers/protocol (e.g., Glue), and/or physical components/devices (e.g., Physical).

As shown in FIG. 7A, and by reference number 702, IoT system server 230 starts to create a new IoT system architecture for an IoT system, based on the user of user device 210 selecting that the user of user device 210 seeks to create a new IoT system architecture (e.g., "Develop a new IoT system") and provides the selection to IoT system server 230.

Figure 7B:
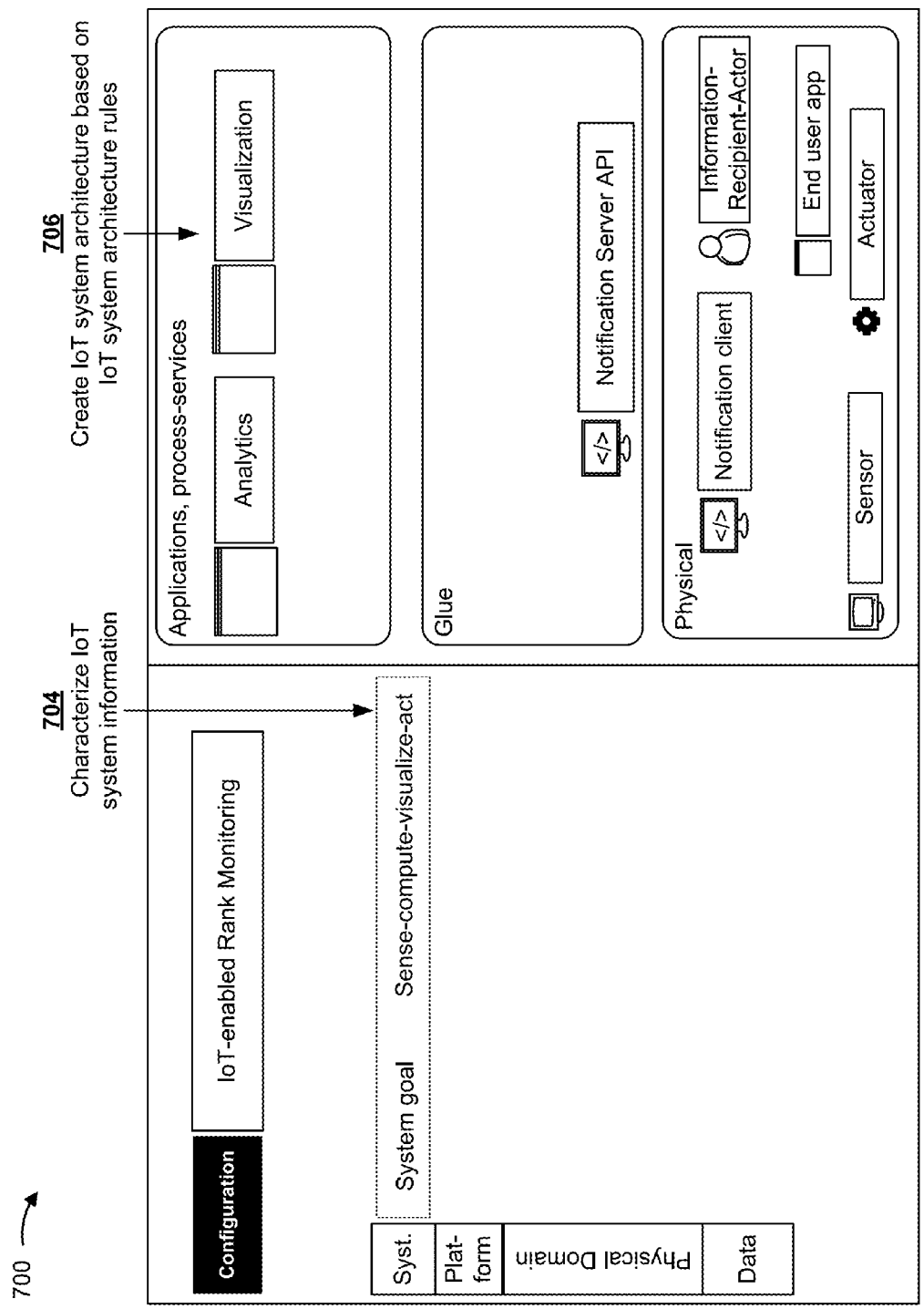

As shown in FIG. 7B, and by reference number 704, IoT system server 230 characterizes the IoT system information by obtaining a system goal (e.g., IoT system server 230 obtains a system goal as 'Sense-compute-visualize-act,' provided by the user of the user device). As shown in FIG. 7B, and by reference number 706, IoT system server 230 creates an IoT system architecture, based on IoT system architecture rules for the system goal provided (e.g., for the system goal='Sense-compute-visualize-act, IoT system server 230 creates the 'Applications/process-services' to include an analytics application and a visualization application, the 'Glue' to include a notification server API, and the 'Physical' to include a notification client, a sensor, an actuator, an end-user application, and an information-recipient-actor application).

Figure 7C:
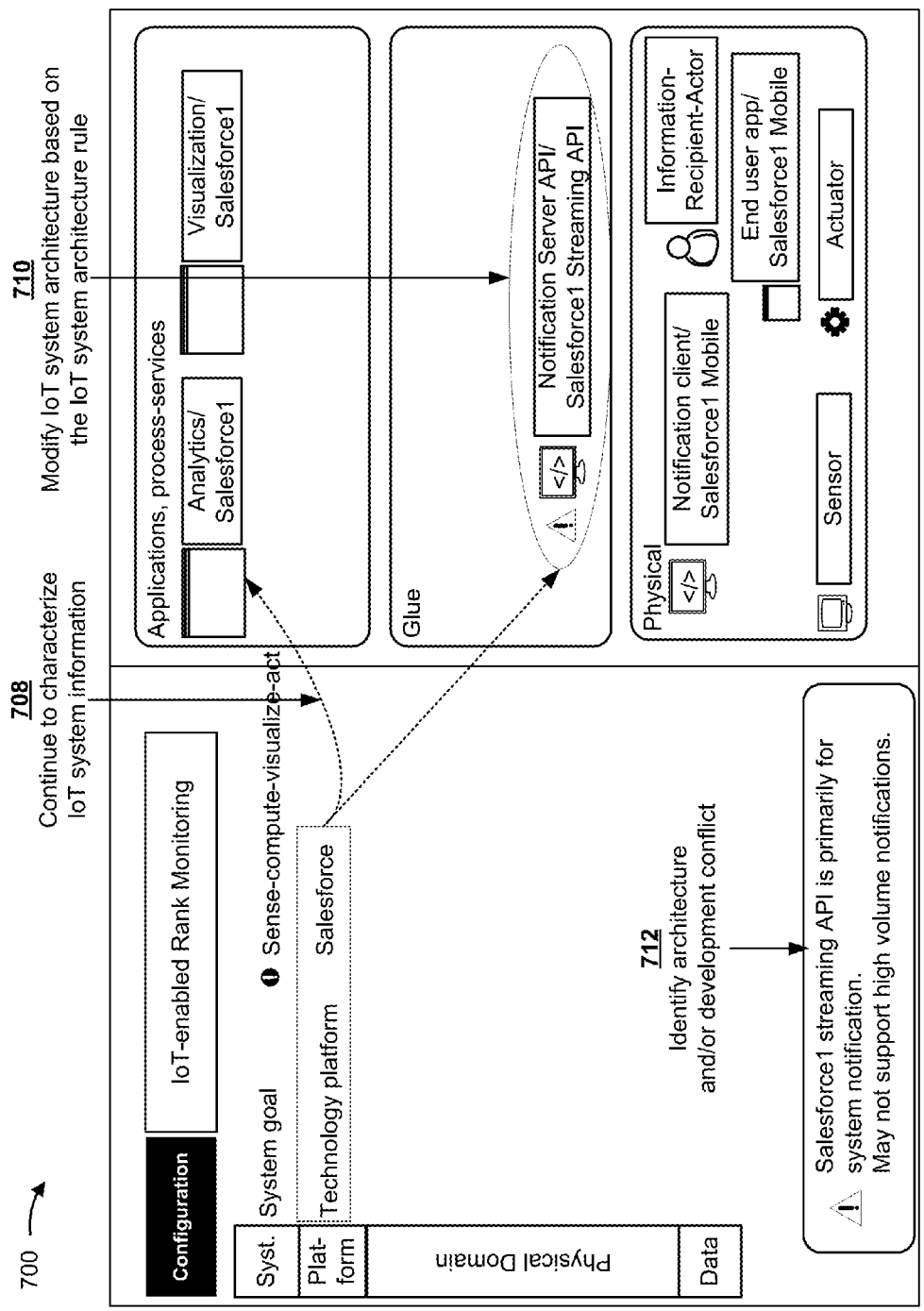

As shown in FIG. 7C, and by reference number 708, IoT system server 230 continues to characterize the IoT system information by obtaining a technology platform (e.g., IoT system server 230 obtains the technology platform as 'Salesforce' from the user of user device 210). As shown in FIG. 7C, and by reference number 710, IoT system server 230 modifies the IoT system architecture, based on IoT system architecture rules for the technology platform provided (e.g., for the technology platform='Salesforce,' IoT system server 230 modifies the IoT system architecture so that the analytics application includes 'Salesforce1,' the visualization application includes 'Salesforce1,' the notification server API includes 'Salesforce1/Streaming API,' the notification client includes 'Salesforce 1 Mobile,' and the end user app includes 'Salesforce 1 Mobile').

As shown in FIG. 7C, and by reference number 712, IoT system server 230 identifies an architecture and/or development conflict, based on characterizations provided by the user of user device 210 (e.g., 'Salesforce1 streaming API is primarily for application notifications. May not support high volume notifications.').

Figure 7D:
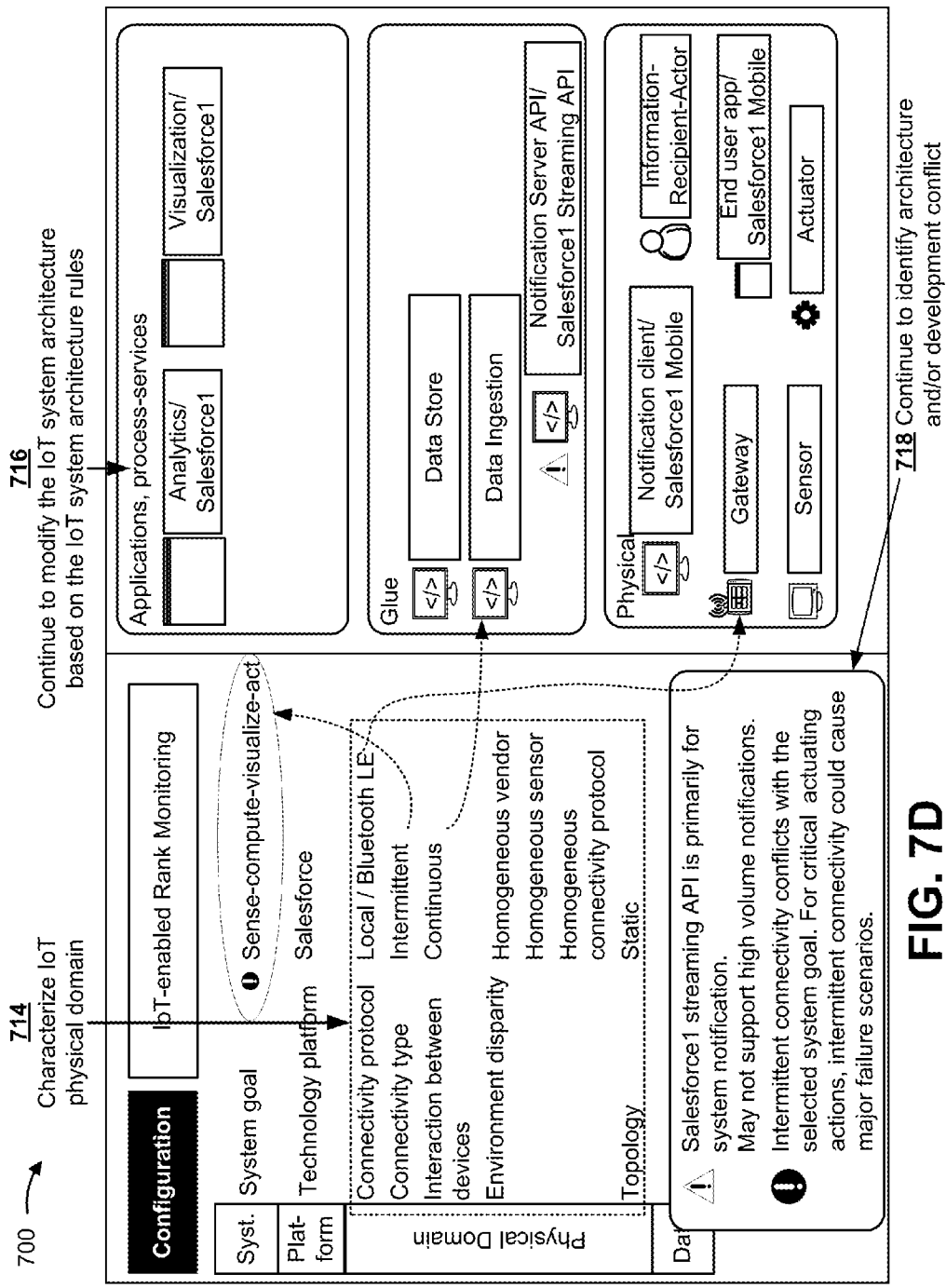

As shown in FIG. 7D, and by reference number 714, IoT system server 230 characterizes an IoT physical domain (e.g., a connectivity protocol='Local/Bluetooth LE;' a connectivity type='Intermittent,' an interaction between devices='Continuous,' an environment disparity='Homogenous vendor,' 'Homogenous sensor,' and 'Homogenous connectivity protocol;' a topology='Static,' etc.).

As shown in FIG. 7D, and by reference number 716, IoT system server 230 continues to modify the IoT system architecture, based on IoT system architecture rules for the characterization of the physical domain provided (e.g., for the physical domain characterization provided, IoT system server 230 modifies the 'Glue' to include a data store interface layer and a data ingestion interface layer, and the 'Physical' to include a gateway).

As shown in FIG. 7D, and by reference number 718, IoT system server 230 continues to identify architecture and/or development conflicts, based on the characterization of the physical domain provided (e.g., 'Salesforce 1 streaming API is primarily for application notification. May not support high volume notifications. Intermittent connectivity conflicts with the selected system goal. For critical actuating actions, intermittent connectivity could cause major failure scenarios.').

Figure 7E:
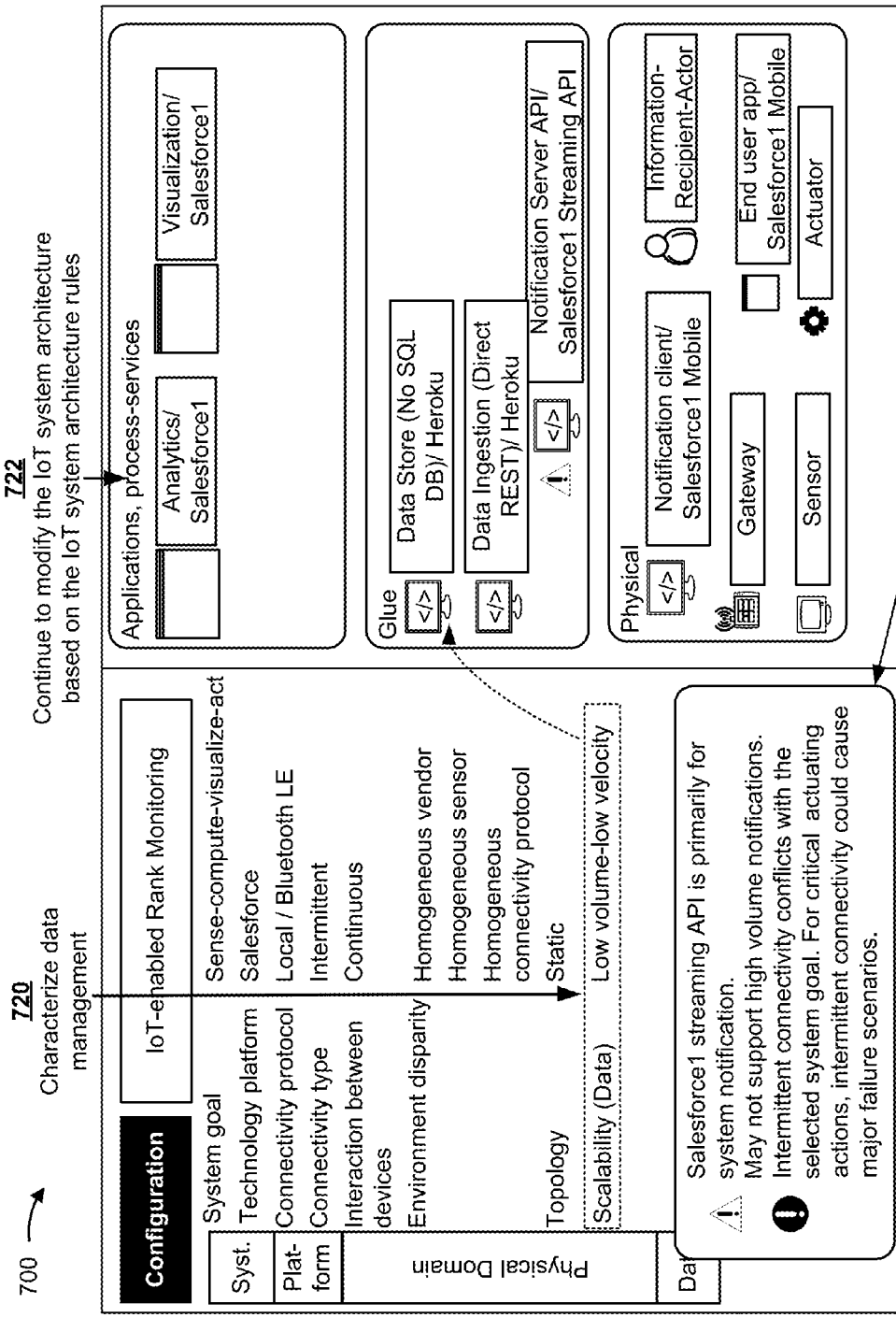

As shown in FIG. 7E, and by reference number 720, IoT system server 230 characterizes data management (e.g., scalability for data=Low volume-low velocity). As shown in FIG. 7E, and by reference number 722, IoT system server 230 continues to modify the IoT system architecture, based on the IoT system architecture rules for the characterization of the data management (e.g., for scalability for data=Low volume-low velocity, IoT system server 230 modifies the IoT system architecture so that the 'Glue' includes a data store interface layer that includes '(No SQL DB)/Heroku' and a data ingestion interface layer that includes '(Direct REST)/Heroku').

As shown in FIG. 7E, and by reference number 724, IoT system server 230 continues to identify architecture and/or development conflicts, based on the characterization of the data management provided (e.g., 'Salesforce 1 streaming API is primarily for application notification. May not support high volume notifications. Intermittent connectivity conflicts with the selected system goal. For critical actuating actions, intermittent connectivity could cause major failure scenarios.').

Figure 7F:
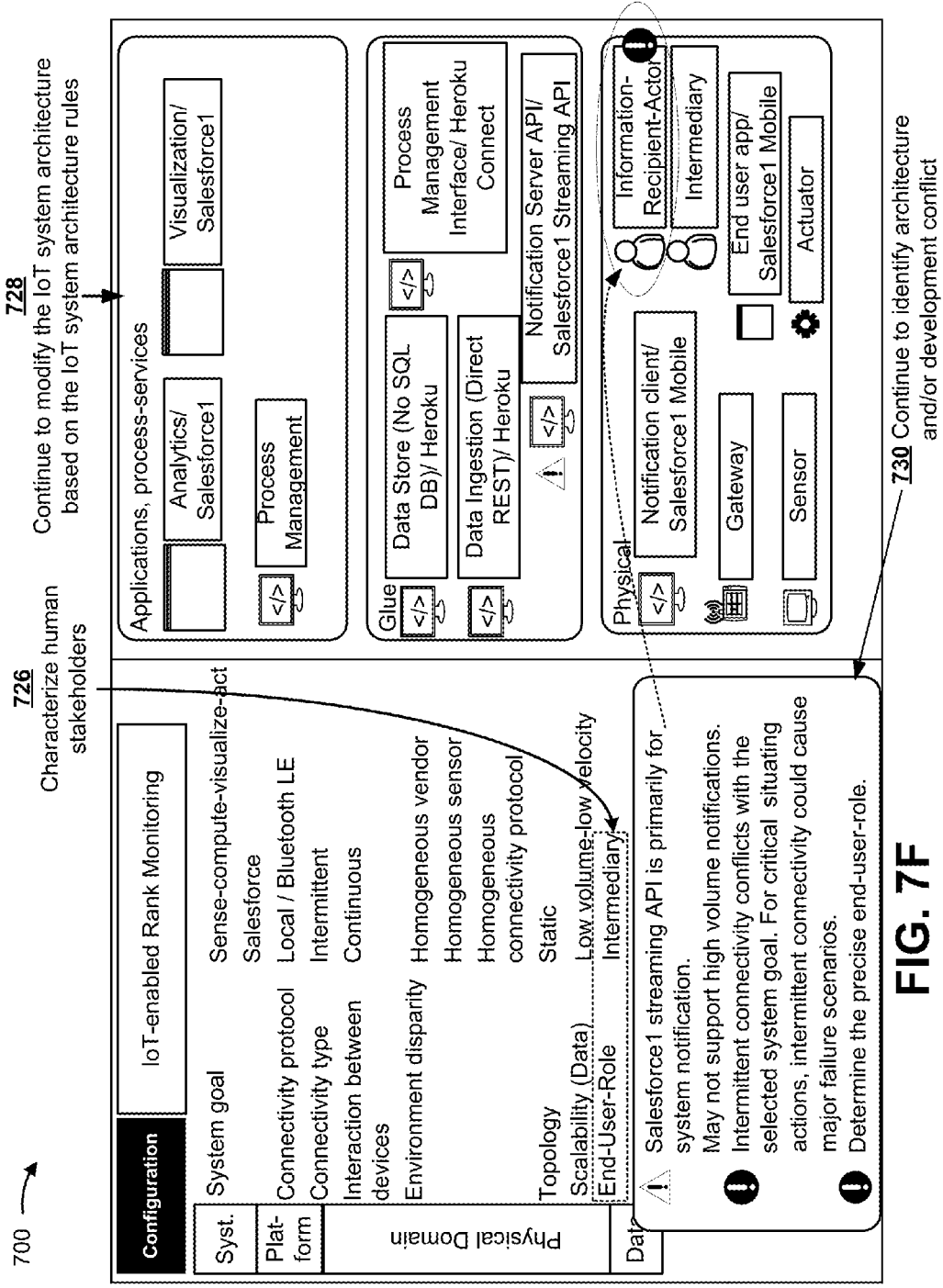

As shown in FIG. 7F, and by reference number 726, IoT system server 230 characterizes human stakeholders (e.g., End-user-role=Intermediary). As shown in FIG. 7F, and by reference number 728, IoT system server 230 continues to modify the IoT system architecture, based on the IoT system architecture rules for the characterization of the human stakeholder provided (e.g., for the end-user-role='Intermediary,' IoT system server 230 modifies the IoT system architecture so that the 'Applications/process-services' include a process management application, the 'Glue' includes a process management interface/Heroku connect, and the 'Physical' includes an intermediary device).

As shown in FIG. 7F, and by reference number 730, IoT system server 230 continues to identify architecture and/or development conflicts, based on the characterization of the human stakeholders (e.g., 'Salesforce 1 streaming API is primarily for application notification. May not support high volume notifications. Intermittent connectivity conflicts with the selected system goal. For critical actuating actions, intermittent connectivity could cause major failure scenarios. Determine the precise end-user-role.').

Figure 7G:
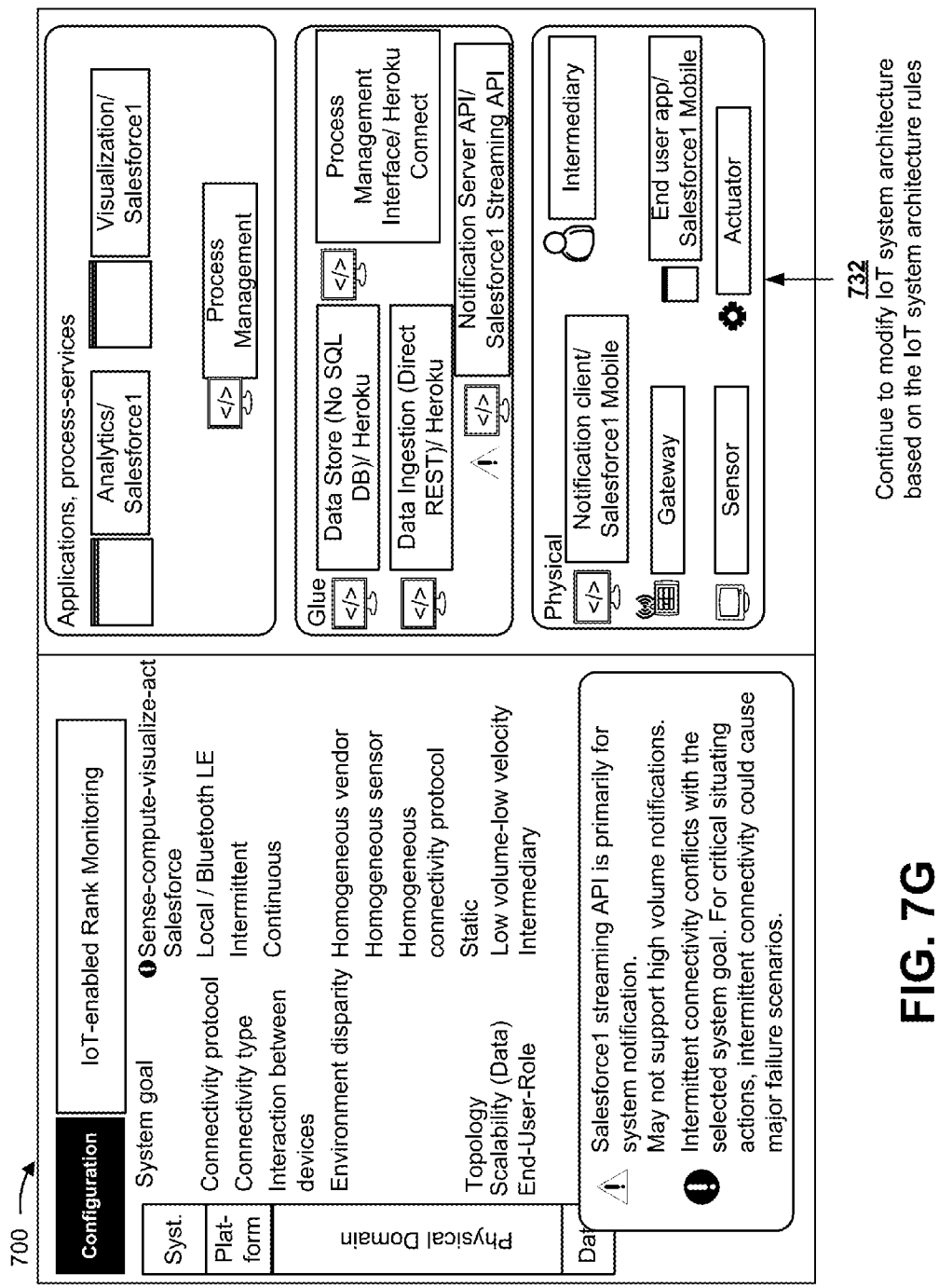

As shown in FIG. 7G, and by reference number 732, IoT system server 230 continues to modify the IoT system architecture based on the IoT system rules related to the architecture and/or development conflict identified (e.g., removing the physical component for the information-recipient-actor from the 'Physical' based on the architecture and/or development conflict identified).

Figure 7H:
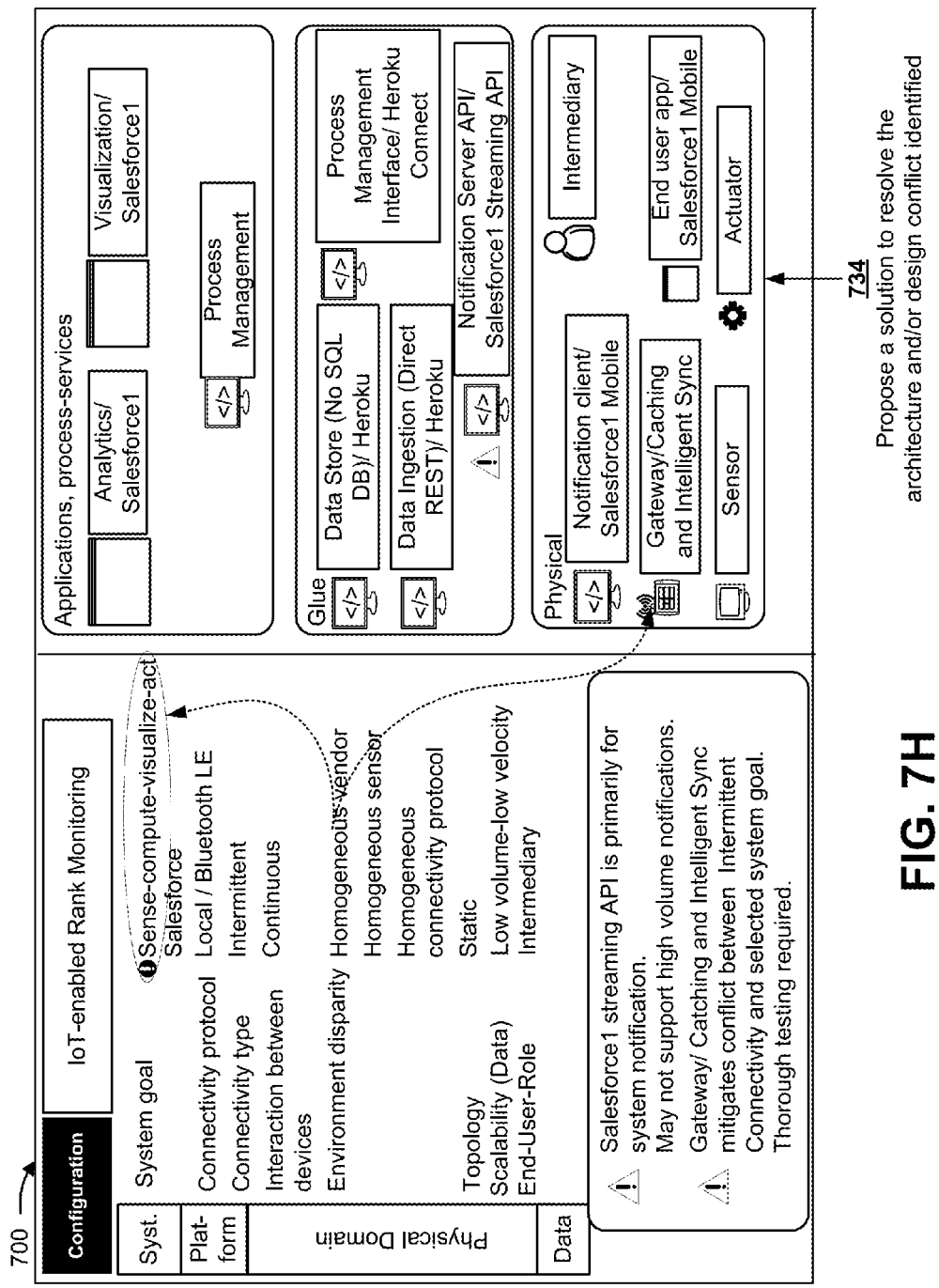

As shown in FIG. 7H, and by reference number 734, IoT system server 230 proposes a solution to resolve the architecture and/or design conflict identified (e.g., IoT system server 230 proposes a solution of modifying the gateway physical component to include 'Gateway/caching and Intelligent sync,' stating, 'Gateway/caching and intelligent sync mitigates conflict between intermittent connectivity and a selected system goal. Thorough testing is required.').

Figure 7I:
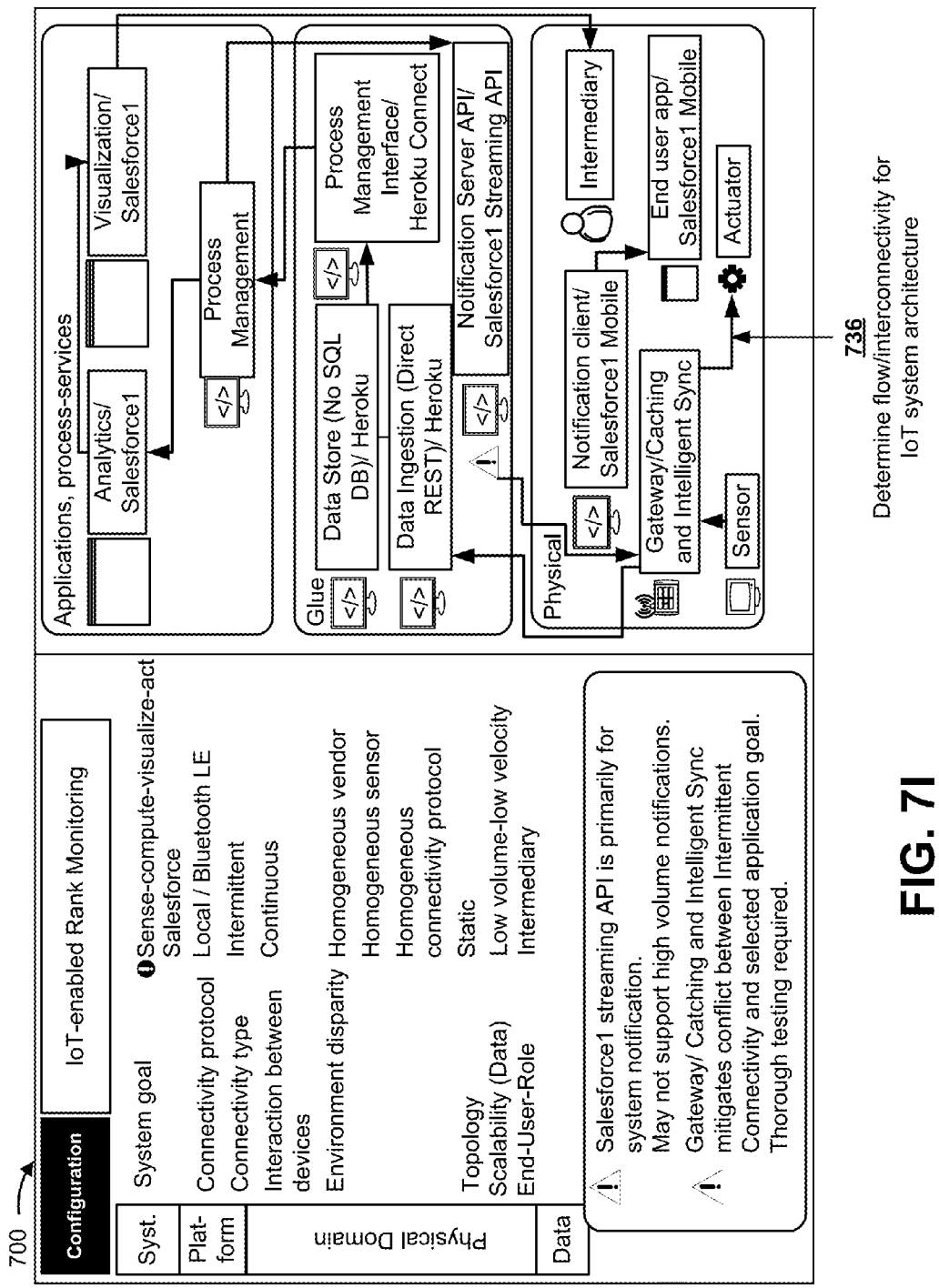

As shown in FIG. 7I, and by reference number 736, IoT system server 230 determines flow/interconnectivity for the IoT system architecture (e.g., the flow/interconnectivity between, for example, the IoT architecture components for the Applications/process-services, the Glue, and the Physical, or the like).

As shown in FIG. 7J, and by reference number 738, IoT system server 230 creates an IoT system architecture report (e.g., an IoT system architecture report for the IoT-enabled rack monitoring system including, for example, architecture decisions and components, development tasks, considerations, further decisions, or the like).

Figure 7K:
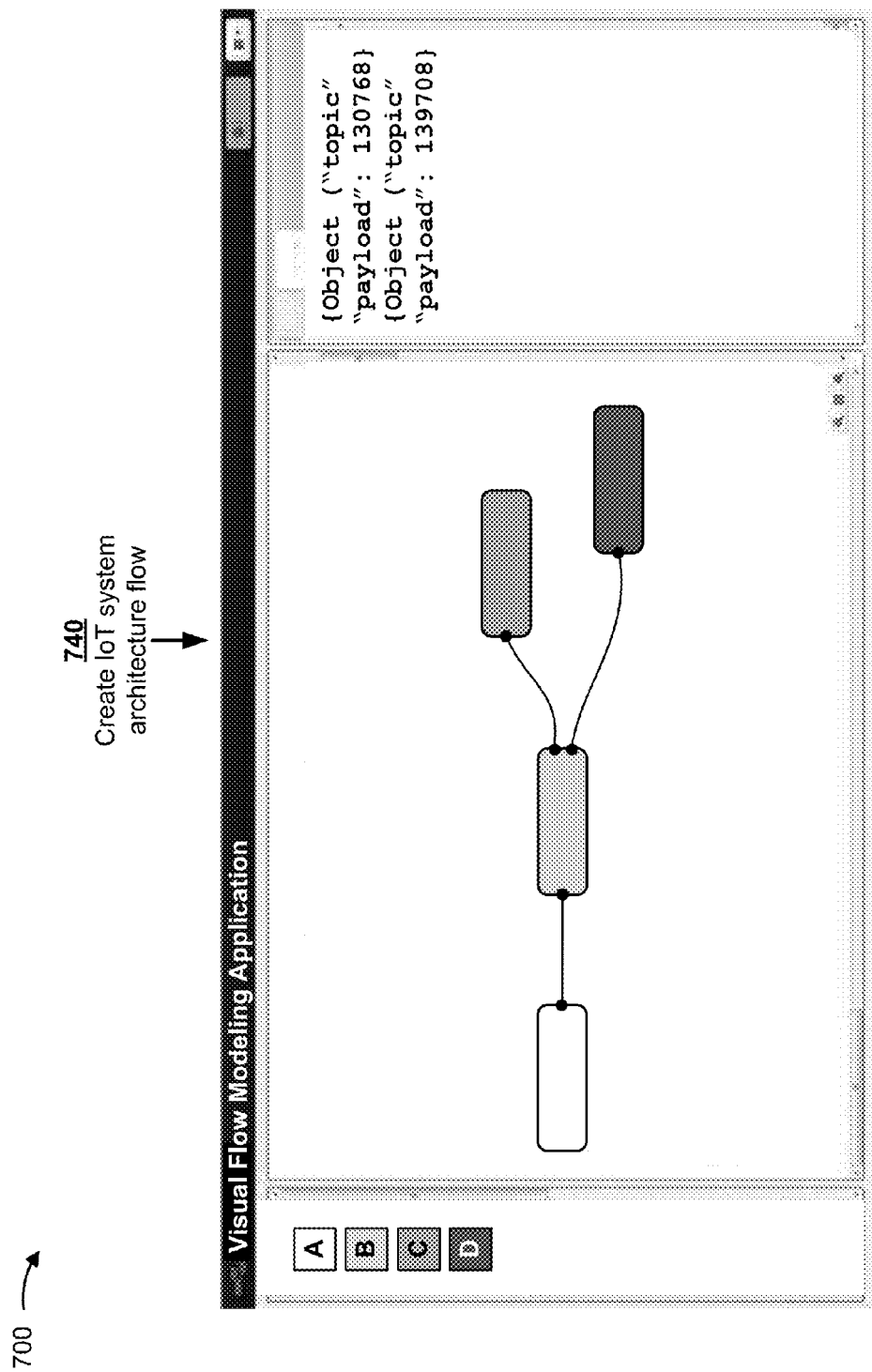

As shown in FIG. 7K, and by reference number 740, IoT system server 230 creates an IoT system architecture flow (e.g., an IoT system architecture flow for the IoT-enabled rack monitoring system using a visual flow modeling application to display the IoT system architecture, relationship between various architecture components, and underlying code).

Figure 7L:
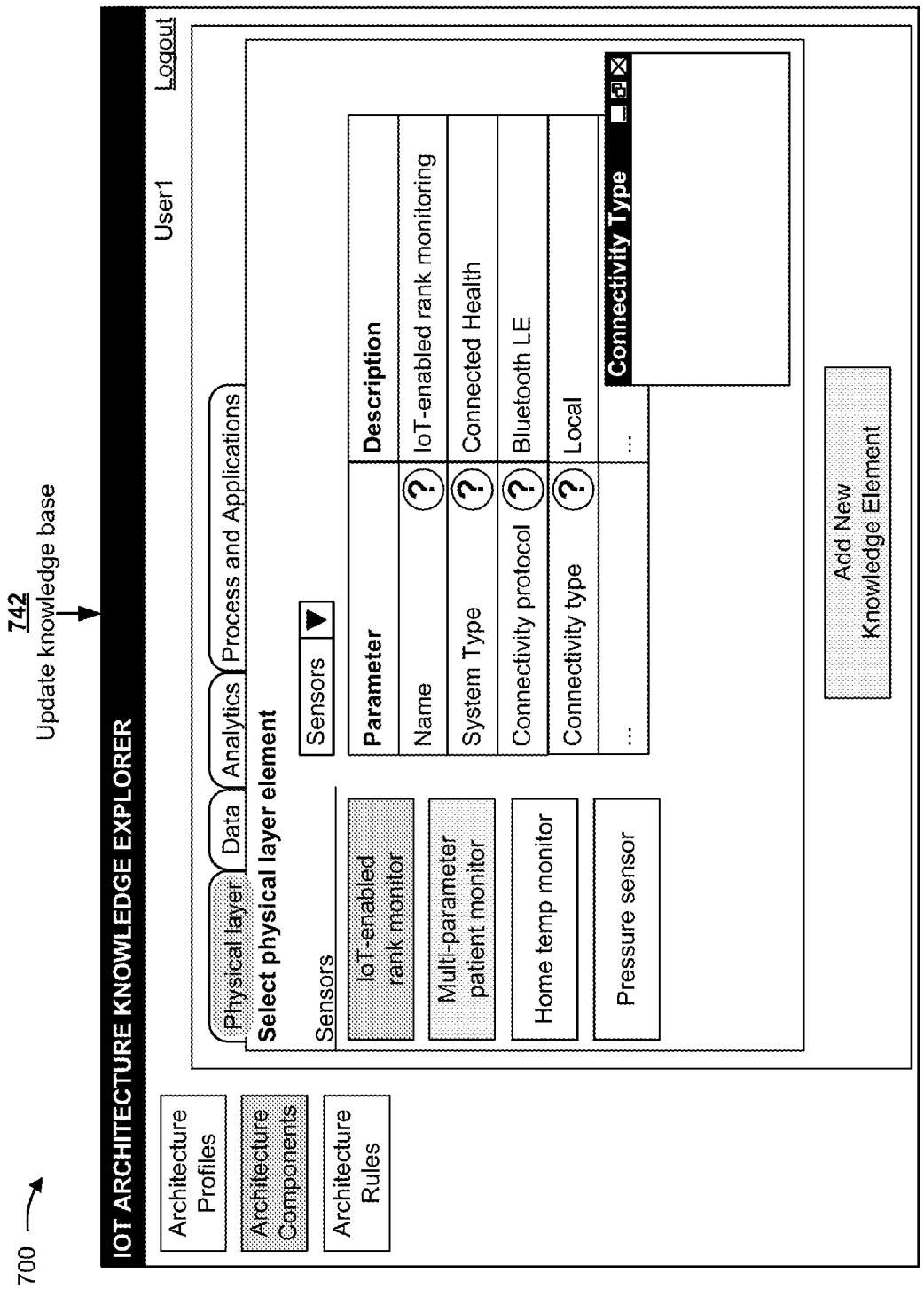

As shown in FIG. 7L, and by reference number 742, IoT system server 230 updates the knowledge base. The user of user device 210 accesses the IoT system architecture and provides updates to the knowledge base by storing, for example, the IoT system architecture, the IoT system architecture report, the IoT system architecture flow, the IoT system architecture guide, the associated best practices, or the like (e.g., by interacting with an input mechanism "Add New Knowledge Element" for the IoT-enabled rank monitoring system to update the knowledge base).

As indicated above, FIGS. 7A-7L are provided merely as an example. Other examples are possible and may differ from what was described with regard to FIGS. 7A-7L.

In this way, by using a knowledge-based approach, the IoT system server 230 may create an IoT system architecture based on, for example, previously created/obtained IoT system architectures, previously created/obtained IoT system architecture components, associated best practices, or the like, thereby saving a system's resources and/or processing power from having to entirely create an IoT system architecture from scratch and/or software for each new IoT system, providing diverse functionality, use, and scalability.

By using questions and/or a sequence of questions to characterize the IoT system and/or identify a previously created/obtained IoT system architecture that may be relevant, changes and testing, based on current IoT system requirements may be minimal, thereby reducing a time to deliver the IoT system architecture and/or the IoT system.

The foregoing disclosure provides illustration and description, but is not intended to be exhaustive or to limit the implementations to the precise form disclosed. Modifications and variations are possible in light of the above disclosure or may be acquired from practice of the implementations.

As used herein, the term component is intended to be broadly construed as hardware, firmware, and/or a combination of hardware and software.

Certain user interfaces have been described herein and/or shown in the figures. A user interface may include a graphical user interface, a non-graphical user interface, a text-based user interface, etc. A user interface may provide information for display. In some implementations, a user may interact with the information, such as by providing input via an input component of a device that provides the user interface for display. In some implementations, a user interface may be configurable by a device and/or a user (e.g., a user may change the size of the user interface, information provided via the user interface, a position of information provided via the user interface, etc.). Additionally, or alternatively, a user interface may be pre-configured to a standard configuration, a specific configuration based on a type of device on which the user interface is displayed, and/or a set of configurations based on capabilities and/or specifications associated with a device on which the user interface is displayed.

It will be apparent that systems and/or methods, described herein, may be implemented in different forms of hardware, firmware, or a combination of hardware and software. The actual specialized control hardware or software code used to implement these systems and/or methods is not limiting of the implementations. Thus, the operation and behavior of the systems and/or methods were described herein without reference to specific software code—it being understood that software and hardware can be designed to implement the systems and/or methods based on the description herein.

Even though particular combinations of features are recited in the claims and/or disclosed in the specification, these combinations are not intended to limit the disclosure of possible implementations. In fact, many of these features may be combined in ways not specifically recited in the claims and/or disclosed in the specification. Although each dependent claim listed below may directly depend on only one claim, the disclosure of possible implementations includes each dependent claim in combination with every other claim in the claim set.

No element, act, or instruction used herein should be constructed as critical or essential unless explicitly described as such. Also, as used herein, the articles "a" and "an" are intended to include one or more items, and may be used interchangeably with "one or more." Furthermore, as used herein, the terms "group" and "set" are intended to include one or more items (e.g., related items, unrelated items, a combination of related items and unrelated items, etc.), and may be used interchangeable with "one or more." Where only one item is intended, the term "one" or similar language is used. Also, as used herein, the terms "has," "have," "having," or the like are intended to be open ended terms. Further, the phrase "based on" is intended to mean "based, at least in part, on" unless explicitly stated otherwise.

What is claimed is:

1. A system, comprising:
   one or more server devices to:
      provide one or more questions, to a user of a user device, to characterize an Internet of things system, a characterization of the Internet of thing system being associated with at least one of:
         a system goal,
         a technology platform,
         connectivity,
         scalability, or
         an end-user-role;
      obtain one or more responses from the user of the user device associated with the one or more questions;
      provide, based on the one or more responses, a list of existing Internet of things system profiles;
      obtain an existing Internet of things system profile selected from the list;
      retrieve a previously created and/or obtained Internet of things system architecture associated with the existing Internet of things system profile;
      obtain one or more modifications to the previously created and/or obtained Internet of things system architecture to create a new Internet of things system architecture; and
      automatically perform the one or more modifications to create the new Internet of things system architecture, the new Internet of things system architecture defining the Internet of things system by applying associated Internet of things system architecture rules to the one or more responses.

2. The system of claim 1, where the one or more server devices are further to:
   identify an architecture and/or development conflict in the new Internet of things system architecture based on at least two responses, associated with at least two questions, of the one or more questions, provided to characterize the Internet of things system.

3. The system of claim 2, where the one or more server devices are further to:
   determine a solution to the architecture and/or development conflict; and
   provide the solution.

4. The system of claim 3, where the one or more server devices are further to:
   obtain one or more updated responses from the user of the user device based on at least one of:
      the architecture and/or development conflict, or
      the solution.

5. The system of claim 1, where the one or more server devices are further to:
   create an Internet of things system architecture report that includes at least one of:
      the new Internet of things system architecture,
      a list of architecture decisions and components,
      a list of tasks for development,
      a list of considerations for building the Internet of things system, or
      a list of decisions related to creating the Internet of things system; and
   output the Internet of things system architecture report.

6. The system of claim 1, where the one or more server devices are further to:
   create an Internet of things system architecture flow that visually provides Internet of things system architecture components and interconnectivity for the system; and
   output the Internet of things system architecture flow.

7. The system of claim 1, where the one or more server devices are further to:
   create an Internet of things system architecture guide that enables an Internet of things system developer to build the Internet of things system; and
   output the Internet of things system architecture guide.

8. The system of claim 1, where the one or more server devices are further to:
   update a knowledge base by storing at least one of:
      the new Internet of things system architecture,
      an associated Internet of things system architecture report including at least one of:
         information regarding the new Internet of things system architecture,
         a list of architecture decisions and components,
         a list of tasks for development,
         a list of considerations for building the Internet of things system, or
         a list of decisions related to creating the Internet of things system,
      an associated Internet of things system architecture flow visually providing Internet of things system architecture components and interconnectivity for the Internet of things system,
      an associated Internet of things system architecture guide enabling an Internet of things system developer to build the Internet of things system, or
      associated best practices information.

9. A computer-readable medium storing instructions, the instructions comprising:
   one or more instructions that, when executed by one or more processors, cause the one or more processors to:
      provide one or more questions, to a user of a user device, to characterize an Internet of things system, a characterization of the Internet of thing system being associated with at least one of:

a system goal,
a technology platform,
connectivity,
scalability, or
an end-user-role;
obtain one or more responses, from the user of the user device, associated with each of the one or more questions;
provide, based on the one or more responses, a list of existing Internet of things system profiles;
obtain an existing Internet of things system profile selected from the list;
identify previously created, obtained, and/or stored Internet of things system architecture associated with the existing Internet of things system profile;
obtain modifications to the previously created, obtained, and/or stored Internet of things system architecture; and
automatically perform the modifications to create a new Internet of things system architecture,
the new Internet of things system architecture defining the Internet of things system by applying associated Internet of things system architecture rules to the one or more responses.

10. The computer-readable medium of claim 9, where the one or more instructions, when executed by the one or more processors, further cause the one or more processors to:
determine whether to create the new Internet of things system architecture; and
where the one or more instructions, that cause the one or more processors to provide the one or more questions, cause the one or more processors to:
provide the one or more questions based on determining to create the new Internet of things system architecture.

11. The computer-readable medium of claim 9, where the new Internet of things system architecture is a first Internet of things system architecture; and
where the one or more instructions, when executed by the one or more processors, further cause the one or more processors to:
determine whether to create a second Internet of things system architecture;
select an existing Internet of things system architecture based on determining not to create the second Internet of things system architecture; and
use the existing Internet of things system architecture for creating the first Internet of things system architecture.

12. The computer-readable medium of claim 11, where the modifications are obtained automatically without input from the user of the user device.

13. The computer-readable medium of claim 11, where the one or more instructions, when executed by the one or more processors, further cause the one or more processors to:
create at least one of:
an Internet of things system architecture report including at least one of:
information regarding the new Internet of things system architecture,
a list of architecture decisions and components,
a list of tasks for development,
a list of considerations for building the Internet of things system, or
a list of decisions related to creating the Internet of things system,
an Internet of things system architecture flow visually providing Internet of things system architecture components and interconnectivity for the Internet of things system, or
an Internet of things system architecture guide enabling an Internet of things system developer to build the Internet of things system; and
output at least one of:
the Internet of things system architecture report,
the Internet of things system architecture flow, or
the Internet of things system architecture guide.

14. The computer-readable medium of claim 11, where the one or more questions relate to at least one of:
characterizing information,
characterizing a physical domain,
characterizing data management, or
characterizing human stakeholders related to the Internet of things system.

15. The computer-readable medium of claim 9, where the associated Internet of things system architecture rules are obtained based on input from the user of the user device.

16. A method, comprising:
providing, by a system that includes one or more processors, one or more questions, to a user of a user device, to characterize an Internet of things system,
a characterization of the Internet of thing system being associated with at least one of:
a system goal,
a technology platform,
connectivity,
scalability, or
an end-user-role;
obtaining, by the system, one or more responses from the user of the user device associated with the one or more questions;
providing, by the system and based on the one or more responses, a list of existing Internet of things system profiles;
obtaining, by the system, an existing Internet of things system profile selected from the list;
retrieving, by the system, a previously created, obtained, and/or stored Internet of things system architecture associated with the existing Internet of things system profile;
obtaining, by the system, modifications to the previously created, obtained, and/or stored Internet of things system architecture to create a new Internet of things system architecture;
automatically performing, by the system, the modifications to create the new Internet of things system architecture,
the new Internet of things system architecture defining the Internet of things system by applying associated Internet of things system architecture rules to the one or more responses; and
outputting, by the system, the new Internet of things system architecture.

17. The method of claim 16, where the new Internet of things system architecture is a first Internet of things system architecture; and
where the method further comprises:
determining whether to create a second Internet of things system architecture;
determining whether to use the existing Internet of things system profile or a custom Internet of things system profile, based on determining not to create the second Internet of things system architecture; and creating a custom Internet of things system architecture based on the custom Internet of things system profile.

18. The method of claim 17, where the previously created, obtained, and/or stored Internet of things system architecture is a first previously created, obtained, and/or stored Internet of things system architecture;

where the method further comprises:
identifying at least one of a second previously created, obtained, and/or stored Internet of things system architecture or Internet of things system architecture components matching the custom Internet of things system profile; and where creating the custom Internet of things system architecture based on the custom Internet of things system profile comprises:
creating the custom Internet of things system architecture based on using at least one of:
the second previously created, obtained, and/or stored Internet of things system architecture, or
Internet of things system architecture components.

19. The method of claim 16, further comprising:
identifying an architecture and/or development conflict based on at least two responses associated with at least two questions of the one or more questions;
providing one or more new questions, to the user of the user device, based on the architecture and/or development conflict;
obtaining one or more new responses, from the user of the user device, associated with one or more new questions; and
performing the modifications based on the one or more new responses associated with one or more new questions.

20. The method of claim 16, further comprising:
automatically generating an Internet of things system prototype based on the new Internet of things system architecture.

* * * * *